(12) United States Patent
Mikawa et al.

(10) Patent No.: US 8,227,788 B2
(45) Date of Patent: Jul. 24, 2012

(54) NONVOLATILE MEMORY ELEMENT, AND NONVOLATILE MEMORY DEVICE

(75) Inventors: Takumi Mikawa, Shiga (JP); Kiyotaka Tsuji, Osaka (JP); Takashi Okada, Osaka (JP)

(73) Assignee: Panasonic Corporation, Osaka (JP)

( * ) Notice: Subject to any disclaimer, the term of this patent is extended or adjusted under 35 U.S.C. 154(b) by 186 days.

(21) Appl. No.: 12/863,535

(22) PCT Filed: Nov. 18, 2009

(86) PCT No.: PCT/JP2009/006196
§ 371 (c)(1),
(2), (4) Date: Jul. 19, 2010

(87) PCT Pub. No.: WO2010/058569
PCT Pub. Date: May 27, 2010

(65) Prior Publication Data
US 2010/0295012 A1    Nov. 25, 2010

(30) Foreign Application Priority Data

Nov. 19, 2008  (JP) ................................. 2008-295866

(51) Int. Cl.
*H01L 21/00* (2006.01)
(52) U.S. Cl. ......... 257/4; 257/2; 257/3; 257/5; 438/250; 438/570; 365/148
(58) Field of Classification Search .................. 438/250, 438/570; 257/2, 3, 4, 5; 365/148
See application file for complete search history.

(56) References Cited

U.S. PATENT DOCUMENTS

| | | | | |
|---|---|---|---|---|
| 7,535,035 B2 * | 5/2009 | Baek et al. | ..................... | 257/208 |
| 7,911,824 B2 * | 3/2011 | Kawai et al. | .................. | 365/148 |
| 7,916,516 B2 * | 3/2011 | Wei et al. | ..................... | 365/148 |
| 7,920,402 B2 * | 4/2011 | Katoh et al. | .................. | 365/100 |
| 2007/0015328 A1 | 1/2007 | Hsu et al. | | |
| 2007/0015329 A1 | 1/2007 | Li et al. | | |
| 2007/0015330 A1 | 1/2007 | Li et al. | | |
| 2007/0015348 A1 | 1/2007 | Hsu et al. | | |

(Continued)

FOREIGN PATENT DOCUMENTS
EP    2 128 901 A1    12/2009
(Continued)

*Primary Examiner* — Jarrett Stark
*Assistant Examiner* — Nicholas Tobergte
(74) *Attorney, Agent, or Firm* — McDermott Will & Emery LLP

(57) ABSTRACT

A nonvolatile memory element comprises a resistance variable element 105 configured to reversibly change between a low-resistance state and a high-resistance state in response to electric signals with different polarities which are applied thereto; and a current controlling element 112 configured such that when a current flowing when a voltage whose absolute value is a first value as a desired value which is larger than 0 and smaller than a predetermined voltage value and whose polarity is a first polarity is applied is a first current and a current flowing when a voltage whose absolute value is the first value and whose polarity is a second polarity different from the first polarity is applied is a second current, the first current is higher than the second current, and the resistance variable element is connected in series with the current controlling element such that a polarity of a voltage applied to the current controlling element when the resistance variable element is changed from the low-resistance state to the high-resistance state is the first polarity.

15 Claims, 19 Drawing Sheets

U.S. PATENT DOCUMENTS

| | | |
|---|---|---|
| 2007/0165442 A1 | 7/2007 | Hosoi et al. |
| 2007/0284575 A1 | 12/2007 | Li et al. |
| 2008/0006814 A1 | 1/2008 | Hsu et al. |
| 2008/0025072 A1 | 1/2008 | Tamai et al. |
| 2009/0032817 A1 | 2/2009 | Li et al. |
| 2009/0052225 A1 | 2/2009 | Morimoto |
| 2009/0224224 A1 | 9/2009 | Fujii et al. |
| 2009/0321711 A1 | 12/2009 | Takagi et al. |
| 2010/0032641 A1 | 2/2010 | Mikawa et al. |

FOREIGN PATENT DOCUMENTS

| | | |
|---|---|---|
| JP | 2006-203098 | 8/2006 |
| JP | 2006-311910 | 11/2006 |
| JP | 2007-027755 | 2/2007 |
| JP | 2007-158325 | 6/2007 |
| JP | 2007-188603 | 7/2007 |
| JP | 2007-267584 | 10/2007 |
| JP | 2007-311772 | 11/2007 |
| JP | 2008-034033 | 2/2008 |
| WO | WO 2008/047530 A1 | 4/2008 |
| WO | WO 2008/059701 A9 | 5/2008 |
| WO | WO 2008/062688 A1 | 5/2008 |
| WO | WO 2008/117494 A1 | 10/2008 |
| WO | WO 2009/050861 A1 | 4/2009 |

* cited by examiner (a)

(b)

| METAL | WORK FUNCTION | SEMICONDUCTOR | ELECTRON AFFINITY |
|---|---|---|---|
| Al | 4.2 | Si | 3.78 |
| Ti | 4.3 | GaAs | 3.57 |
| Cu | 4.4 | GaP | 3.21 |
| Ni | 4.5 | | |
| W | 4.63 | | |
| TaN | 4.74 | | |
| TiN | 5.1 | | |
| Pt | 5.7 | | |

UNIT [eV]

NONVOLATILE MEMORY ELEMENT, AND NONVOLATILE MEMORY DEVICE

RELATED APPLICATIONS

This application is the U.S. National Phase under 35 U.S.C. §371 of International Application No. PCT/JP2009/006196, filed on Nov. 18, 2009, which in turn claims the benefit of Japanese Application No. 2008-295866, filed on Nov. 19, 2008, the disclosures of which Applications are incorporated by reference herein.

TECHNICAL FIELD

The present invention relates to a nonvolatile memory element and a nonvolatile memory device which include a resistance variable element which stably changes resistance values to be retained, in response to voltage pulses applied.

BACKGROUND ART

With recent advancement of digital technologies, electronic hardware such as portable information devices and home information appliances has been developed to provide higher functionality. As the electronic hardware has been developed to provide higher functionality, development of further miniaturized and higher-speed semiconductor elements which are built into the electronic hardware are progressing at a high pace. Among them, the use of large-capacity nonvolatile memories which are represented by a flash memory has been spreading at a rapid pace. Furthermore, as next-generation new nonvolatile memories which have a potential to replace the flash memory, a resistance variable nonvolatile memory device including so-called a resistance variable element (ReRAM) has been researched and developed. As defined herein, the resistance variable element refers to an element which has a characteristic in which a resistance value changes reversibly in response to electric signals and is able to store information corresponding to the resistance value in a nonvolatile manner. Unlike a phase change random access memory (PCRAM) which is adapted to change a resistance value due to a fact that a change of a crystalline state is induced by heat generated by electric stresses applied thereto, the resistance variable element changes its resistance value by changing redox states of a resistance variable material, directly in response to the electric stresses applied thereto, i.e., by migration of electrons.

As an example of a large-capacity nonvolatile memory incorporating the resistance variable elements, a cross-point nonvolatile memory element has been proposed. The cross-point nonvolatile memory element has a structure suitable for miniaturization, and an element including a resistance variable layer as a memory section and a non-linear element such as a varistor as a current controlling element is disclosed (e.g., see patent document 1).

FIG. 19 is a view showing a nonvolatile memory device including a conventional resistance variable element. FIG. 19 is a cross-sectional view of a memory cell 380 taken along the direction of a bit line 310, in a cross-point memory cell array including bit lines 310, word lines 320 and memory cells 380 formed at cross-points of the bit lines 310 and the word lines 320. A resistance variable element 360 includes a resistance variable layer 330 for storing data according to a change in an electric resistance because of electric stresses applied thereto, an upper electrode 340 and a lower electrode 350 sandwiching the resistance variable layer 330 between them. On the upper portion of the resistance variable element 360, there is provided a two-terminal non-linear element 370 having a nonlinear current-voltage characteristic for flowing a current bidirectionally. The memory cell 380 is constituted by a series circuit including the resistance variable element 360 and the non-linear element 370. The non-linear element 370 is a two-terminal element such as a diode, having a nonlinear current-voltage characteristic in which a current changes inconstantly with respect to a voltage change. The bit line 310 serving as an upper wire is electrically connected to the non-linear element 370. The word line 320 serving as a lower wire is electrically connected to the lower electrode 350 of the resistance variable element 360. A current flows bidirectionally through the non-linear element 370 when rewriting for the memory cell 380. For example, as the non-linear element 370, a varistor (ZnO or $SrTiO_3$) having a current-voltage characteristic which is bidirectionally (both at positive voltage side and negative voltage side) symmetric and non-linear, is used. With the above configuration, it is possible to flow a current with a current density of $30 kA/cm^2$ or higher which is required for rewriting for the resistance variable element 360, and achieve a larger capacity.

PRIOR ART DOCUMENTS

Patent Documents

Patent document 1: Japanese Laid-Open Patent Application Publication No. 2006-203098

SUMMARY OF THE INVENTION

Problem to Be Solved by the Invention

However, in the conventional cross-point memory incorporating the current controlling element having a current-voltage characteristic which is bidirectionally symmetric and non-linear, like the varistor, a resistance changing operation (reversible switching between a high-resistance state and a low-resistance state by application of voltages) is unstable, and in some cases the resistance variable element or the current controlling element is broken down due to an excess current.

If a current controlling element with a high current drivability is used to obtain a current required for rewriting, a sneak current flowing to unselected memory cells, which is one problem inherent to the cross-point memory, increases, making it difficult to perform rewriting and reading for a selected cell.

The present invention is directed to solving the above mentioned problem, and an object of the present invention is to provide a resistance variable nonvolatile memory element and a resistance variable nonvolatile memory device which are capable of stabilizing a resistance changing operation and of reducing a sneak current in a cross-point memory.

Means for Solving the Problem

The inventors studied intensively to stabilize the resistance changing operation and to reduce the sneak current in the conventional resistance variable nonvolatile memory element, and found out the following.

In a bipolar resistance variable element which reversibly changes between a high-resistance state and a low-resistance state by application of voltages with different polarities, currents and voltages for allowing the resistance variable element to change from the low-resistance state to the high-resistance state (attain the high-resistance state: perform a reset operation) are higher than currents and voltages for allowing the resistance variable element to change from the high-resistance state to the low-resistance state (attain the low-resistance state: perform a set operation). In other words, the bipolar resistance variable element has an unsymmetric current-voltage characteristic with respect to polarity.

It is assumed that the resistance variable element having such a characteristic is connected to the bidirectionally symmetric current controlling element (element in which resistance is higher when the absolute value of an applied voltage is smaller and a slope ($\Delta I/\Delta V$) of a current-voltage curve is larger as the absolute value of the applied voltage is larger). In this case, if the current drivability of the current controlling element is set relatively higher to flow a current required to change the resistance variable element to the high-resistance state, the current controlling element relatively insufficiently restricts the current when the resistance variable element changes to the low-resistance state, so that an excess current flows through the resistance variable element. In addition, a sneak current flowing through unselected cells increases, making it difficult to write data to and read data from a selected cell. On the other hand, if the current drivability of the current controlling element is set relatively lower to properly restrict the current when the resistance variable element changes to the low-resistance state, a sufficient current does not flow through the resistance variable element when the resistance variable element changes to the high-resistance state, so that the resistance variable element will not fully reach the high-resistance state. This may be a cause of the above mentioned problem. This problem is solved by connecting the current controlling element having an unsymmetric current-voltage characteristic according to the polarity of voltage in series with the resistance variable element, to be compatible with the characteristic of the resistance variable element.

To be specific, in order to solve the above mentioned problem, a nonvolatile memory element of the present invention comprises a resistance variable element configured to reversibly change between a low-resistance state and a high-resistance state in response to electric signals with different polarities which are applied thereto; and a current controlling element configured such that when a current flowing when a voltage whose absolute value is a first value as a desired value which is larger than 0 and smaller than a predetermined voltage value and whose polarity is a first polarity is applied is a first current and a current flowing when a voltage whose absolute value is the first value and whose polarity is a second polarity different from the first polarity is applied is a second current, the first current is higher than the second current; the resistance variable element including a first electrode, a second electrode, and a resistance variable layer which comprises oxygen-deficient transition metal oxide and is provided between the first electrode and the second electrode; the resistance variable element being connected in series with the current controlling element such that a polarity of a voltage applied to the current controlling element when the resistance variable element is changed from the low-resistance state to the high-resistance state is the first polarity; and a resistance changing phenomenon occurring at a specified one of an interface between the first electrode and the resistance variable layer and an interface between the second electrode and the resistance variable layer, in response to the electric signals applied between the first electrode and the second electrode.

In such a configuration, a high current required to change the resistance variable element to the high-resistance state is obtained during a reset operation for attaining the high-resistance state, while a minimum and necessary current which is not substantial in amount can be flowed to change the resistance variable element to the low-resistance state during a set operation for attaining the low-resistance state. As a result, it is possible to implement a resistance variable nonvolatile memory device which performs a resistance changing operation stably. In addition, since the polarity with which the resistance changes is always invariable, it is possible to implement a resistance variable nonvolatile memory device which performs a resistance changing operation more stably.

Another nonvolatile memory element of the present invention comprises a resistance variable element configured to reversibly change between a low-resistance state and a high-resistance state corresponding to a resistance value larger than a resistance value corresponding to the low-resistance state, in response to electric signals with different polarities which are applied thereto; and a bidirectional current controlling element having an unsymmetric characteristic in which when a current flowing when a voltage whose absolute value is a first value as a desired value which is larger than 0 and smaller than a predetermined voltage value and whose polarity is a first polarity is applied is a first current and a current flowing when a voltage whose absolute value is the first value and whose polarity is a second polarity different from the first polarity is applied is a second current, the first current is higher than the second current; the resistance variable element including a first electrode, a second electrode, and a resistance variable layer which comprises oxygen-deficient transition metal oxide and is provided between the first electrode and the second electrode; the resistance variable element being connected in series with the current controlling element such that a direction of a current flowing through the resistance variable element when the resistance variable element is changed from the low-resistance state to the high-resistance state conforms to a direction of the first current flowing through the current controlling element; and a resistance changing phenomenon occurring at a specified one of an interface between the first electrode and the resistance variable layer and an interface between the second electrode and the resistance variable layer, in response to the electric signals applied between the first electrode and the second electrode.

In such a configuration, a high current required to change the resistance variable element to the high-resistance state is obtained during a reset operation for attaining the high-resistance state, while a minimum and necessary current which is not substantial in amount can be flowed to change the resistance variable element to the low-resistance state during a set operation for attaining the low-resistance state. As a result, it is possible to implement a resistance variable nonvolatile memory device which performs a resistance changing operation stably. In addition, since the polarity with which one of the resistance changes is always invariable, it is possible to implement a resistance variable nonvolatile memory device which performs a resistance changing operation more stably.

In the nonvolatile memory element, the resistance variable element may include a first electrode, a second electrode and a resistance variable layer provided between the first electrode and the second electrode. The resistance variable element may be configured such that a resistance value between the first electrode and the second electrode increases when an electric signal with a positive polarity is applied between the first electrode and the second electrode on the basis of the first electrode, and decreases when an electric signal with a negative polarity is applied between the first electrode and the second electrode on the basis of the first electrode. The resistance variable layer may include oxygen-deficient transition metal oxide. The current controlling element may include a third electrode, a fourth electrode and a semiconductor layer provided between the third electrode and the fourth electrode and may be configured such that a polarity with which the fourth electrode is placed at a positive potential on the basis of the third electrode between the third electrode and the fourth electrode is the first polarity. The current controlling element may be configured such that (A) the second electrode is connected to the third electrode such that the resistance variable layer and the semiconductor layer do not intervene between the second electrode and the third electrode; or (B) the first electrode is connected to the fourth electrode such that the resistance variable layer and the semiconductor layer do not intervene between the first electrode and the fourth electrode.

In such a configuration, also, a high current required to change the resistance variable element to the high-resistance state is obtained during a reset operation for attaining the high-resistance state, while a minimum and necessary current which is not substantial in amount can be flowed to change the resistance variable element to the low-resistance state during a set operation for attaining the low-resistance state. As a result, it is possible to implement a resistance variable nonvolatile memory device which performs a resistance changing operation stably.

In the nonvolatile memory element, the resistance variable element may include a first electrode, a second electrode and a resistance variable layer provided between the first electrode and the second electrode. The resistance variable element may be configured such that a resistance value between the first electrode and the second electrode increases when an electric signal with a positive polarity is applied between the first electrode and the second electrode on the basis of the first electrode, and decreases when an electric signal with a negative polarity is applied between the first electrode and the second electrode on the basis of the first electrode. The resistance variable layer may include oxygen-deficient transition metal oxide. The current controlling element may include a third electrode, the first electrode and a semiconductor layer provided between the third electrode and the first electrode and may be configured such that a polarity with which the first electrode is placed at a positive potential on the basis of the third electrode between the third electrode and the first electrode is the first polarity. Or, in the nonvolatile memory element, the resistance variable element may include a first electrode, a second electrode and a resistance variable layer provided between the first electrode and the second electrode. The resistance variable element may be configured such that a resistance value between the first electrode and the second electrode increases when an electric signal with a positive polarity is applied between the first electrode and the second electrode on the basis of the first electrode, and decreases when an electric signal with a negative polarity is applied between the first electrode and the second electrode on the basis of the first electrode. The resistance variable layer may include oxygen-deficient transition metal oxide. The current controlling element may include the second electrode, a fourth electrode and a semiconductor layer provided between the second electrode and the fourth electrode and may be configured such that a polarity with which the fourth electrode is placed at a positive potential on the basis of the second electrode between the second electrode and the fourth electrode is the first polarity.

In such a configuration, since an identical electrode is used for the resistance variable element and the current controlling element, a manufacturing process is simplified and a memory device with a higher density is implemented.

In the nonvolatile memory element, the first electrode may comprise a first material; the second electrode may comprise a second material; and when a standard electrode potential of the first material is V1, a standard electrode potential of the second material is V2, and a standard electrode potential of transition metal of the oxygen-deficient transition metal oxide is Vt, Vt<V2 and V1<V2 may be satisfied.

In such a configuration, by appropriately selecting the electrode material of the resistance variable element, the resistance variable layer is allowed to change its resistance only at a specified region which is the interface between the resistance variable layer and the second electrode with the higher standard electrode potential V2, and it is possible to suppress an incorrect operation at the interface between the resistance variable layer and the first electrode with the standard electrode potential V1 lower than the standard electrode potential Vt of the transition metal of the oxygen-deficient transition metal oxide. In other words, since the polarity with which the resistance changes is always invariable, it is possible to implement a resistance variable nonvolatile memory device which performs a resistance changing operation more stably.

In the nonvolatile memory element, the resistance variable layer may include a first layer which is configured to physically contact the first electrode and has a composition expressed as $MO_x$ (M: transition metal element) and a second layer which is configured to physically contact the second electrode and has a composition expressed as $MO_y$, and x<y may be satisfied.

In such a configuration, the resistance variable layer is allowed to change its resistance only at a specified region with higher oxygen content which is the interface between the resistance variable layer and the second electrode. This is because, in a mechanism of the resistance changing operation, oxidation and reduction of oxygen in the vicinity of the electrode interface are dominant, and therefore the resistance changing phenomenon occurs preferentially at the interface where oxygen which contributes to oxidation and reduction is more in amount. In such a configuration, also, since the polarity with which the resistance changes is always invariable, it is possible to implement a resistance variable nonvolatile memory device which performs the resistance changing operation more stably.

In the nonvolatile memory element, the semiconductor layer may comprise n-type semiconductor; the third electrode and the fourth electrode may comprise different materials; and when electron affinity of the semiconductor layer is $\chi s$, a work function of the third electrode is $\Phi 1$, and a work function of the fourth electrode is $\Phi 2$, $\chi s<\Phi 1<\Phi 2$ may be satisfied.

In such a configuration, there is a height difference between a Schottky barrier between the semiconductor layer and the third electrode and a Schottky barrier between the semiconductor layer and the fourth electrode. Since the current drivability of a diode element is determined by the current in a direction in which a reverse bias voltage is applied at the interface between the semiconductor layer and the metal, the diode element is allowed to have a higher current drivability in the direction in which the reverse bias voltage is applied to the third electrode with a lower barrier. In this case, the current flows more easily in a direction from the fourth electrode to the third electrode than in an opposite direction. It is desirable to connect the first electrode of the resistance variable element to the fourth electrode of the diode element, or connect the second electrode of the resistance variable element to the third electrode of the diode element when the resistance changes at the interface between the resistance variable layer and the second electrode. With such connection, a high current required to change the resistance variable element to the high-resistance state is obtained during a reset operation for attaining the high-resistance state, while a controlled less and necessary current can be flowed to change the resistance variable element to the low-resistance state during a set operation for attaining the low-resistance state. As a result, it is possible to implement a resistance variable nonvolatile memory device which performs a resistance changing operation stably. Further, since it is not necessary to make a difference between a contact area of the upper electrode and the semiconductor layer and a contact area of the lower electrode and the semiconductor layer, the diode elements can be fabricated using the same mask, which effectively reduces the process cost and achieves miniaturization.

In the nonvolatile memory element, the semiconductor layer may comprise n-type semiconductor; the third electrode and the first electrode may comprise different materials; and when electron affinity of the semiconductor layer is $\chi s$, a work function of the third electrode is $\Phi 1$, and a work function of the first electrode is $\Phi 2$, $\chi s<\Phi 1<\Phi 2$ may be satisfied. Or, in the nonvolatile memory element, the semiconductor layer may comprise n-type semiconductor; the second electrode and the fourth electrode may comprise different materials; and when electron affinity of the semiconductor layer is $\chi s$, a work function of the second electrode is $\Phi 1$, and a work function of the fourth electrode is $\Phi 2$, $\chi s<\Phi 1<\Phi 2$ may be satisfied.

In such a configuration, also, a high current required to change the resistance variable element to the high-resistance state is obtained during a reset operation for attaining the high-resistance state, while a controlled less and necessary current can be flowed to change the resistance variable element to the low-resistance state during a set operation for attaining the low-resistance state. As a result, it is possible to implement a resistance variable nonvolatile memory device which performs a resistance changing operation stably. Further, since it is not necessary to make a difference between a contact area of the upper electrode and the semiconductor layer and a contact area of the lower electrode and the semiconductor layer, the diode elements can be fabricated using the same mask, which effectively reduces the process cost and provide miniaturization.

In the nonvolatile memory element, when an area of a portion of the third electrode and a portion of the semiconductor layer which are in contact with each other is S1, and an area of a portion of the fourth electrode and a portion of the semiconductor layer which are in contact with each other is S2, S1>S2 may be satisfied.

In such a configuration, the current controlling element is allowed to have a higher current drivability in the direction in which a reverse bias voltage is applied to the third electrode with a larger contact area. In this case, also, the current flows more in a direction from the fourth electrode to the third electrode. Therefore, it is desirable to connect the first electrode of the resistance variable element to the fourth electrode of the diode element, or the second electrode of the resistance variable element to the third electrode of the diode element when the resistance changes at the interface between the resistance variable layer and the second electrode. With such connection, a high current required to change the resistance variable element to the high-resistance state is obtained during a reset operation for attaining the high-resistance state, while a controlled less and necessary current can be flowed to change the resistance variable element to the low-resistance state during a set operation for attaining the low-resistance state. As a result, it is possible to implement a resistance variable nonvolatile memory device which performs a resistance changing operation stably. Furthermore, since it is not necessary to make a difference in electrode material between the upper electrode and the lower electrode in the current controlling element as described above, metal which would possibly become contamination need not be combined with the semiconductor, which has an advantage in manufacturing method.

In the nonvolatile memory element, when an area of a portion of the third electrode and a portion of the semiconductor layer which are in contact with each other is S1, and an area of a portion of the first electrode and a portion of the semiconductor layer which are in contact with each other is S2, S1>S2 may be satisfied. Or, in the nonvolatile memory element, when an area of a portion of the second electrode and a portion of the semiconductor layer which are in contact with each other is S1, and an area of a portion of the fourth electrode and a portion of the semiconductor layer which are in contact with each other is S2, S1>S2 may be satisfied.

In such a configuration, also, a high current required to change the resistance variable element to the high-resistance state is obtained during a reset operation for attaining the high-resistance state, while a controlled less and necessary current can be flowed to change the resistance variable element to the low-resistance state during a set operation for attaining the low-resistance state. As a result, it is possible to implement a resistance variable nonvolatile memory device which performs a resistance changing operation stably. Furthermore, since it is not necessary to make a difference in electrode material between the upper electrode and the lower electrode in the current controlling element as described above, metal which would possibly become contamination need not be combined with the semiconductor, which has an advantage in manufacturing method.

In the nonvolatile memory element, the transition metal oxide may be tantalum oxide or hafnium oxide.

In such a configuration, it is possible to provide a nonvolatile memory device which has a stable and reversible rewrite characteristic, has a good retention characteristic of a resistance value, as well as high-speed operability, and can be manufactured with a manufacturing process which is highly compatible with a standard Si semiconductor process especially when tantalum oxide is used.

A nonvolatile memory device of the present invention provides a cross-point nonvolatile memory device comprising a substrate; a plurality of first wires which are formed to extend in parallel with each other on the substrate; a plurality of second wires which are formed above the plurality of first wires such that the plurality of second wires extend in parallel with each other within a plane parallel to a main surface of the substrate and three-dimensionally cross the plurality of first wires, respectively; and a plurality of nonvolatile memory elements each of which is described above and which are provided to respectively correspond to three-dimensional cross-points of the plurality of first wires and the plurality of second wires and to electrically connect the first wires to the second wires, respectively.

In such a configuration, it is possible to provide a cross-point memory nonvolatile memory device which is capable of stabilizing a resistance changing operation and reducing a sneak current.

The above object, other objects, features, and advantages of the present invention will be apparent by the following detailed description of preferred embodiment of the inventions, with reference to the accompanying drawings.

Effects of the Invention

In accordance with the resistance variable nonvolatile memory element and the resistance variable nonvolatile memory device of the present invention, a resistance changing operation is stabilized in a nonvolatile memory element including a bipolar resistance variable element. In addition, when the nonvolatile memory element is applied to a cross-point memory array, a sneak current flowing to unselected cells can be reduced.

BRIEF DESCRIPTION OF THE DRAWINGS

FIG. 3 is a view showing a characteristic of a resistance variable element, in which FIG. 3(a) is a graph showing an exemplary current-voltage characteristic of a resistance variable element 105 and FIG. 3(b) is a graph showing an exemplary change in a resistance value in a case where electric pulses are applied to the resistance variable element 105.

FIG. 4 is a view for explaining a current controlling element having a symmetric current-voltage characteristic, in which FIG. 4(a) is a view of an energy band in a thickness direction of a current controlling element including n-type semiconductor, and lower and upper electrodes which comprise the same metal and sandwich the n-type semiconductor, and FIG. 4(b) is a graph schematically showing a current-voltage characteristic of the current controlling element of FIG. 4(a).

FIG. 5 is a view for explaining a current controlling element having a unsymmetric current-voltage characteristic, in which FIG. 5(a) is a view of an energy band in a thickness direction of a current controlling element 112 (current controlling element including n-type semiconductor, lower and upper electrodes which comprise different metals and sandwich the n-type semiconductor), and FIG. 5(b) is a graph schematically showing the current-voltage characteristic of the current controlling element of FIG. 5(a).

FIG. 6 is a view showing a voltage division relationship and a current at each of interfaces in a current controlling element, in which FIG. 6(a) is a view showing the voltage division relationship and the current at each of the interfaces in the symmetric current controlling element of FIG. 4 and FIG. 6(b) is a view showing the voltage division relationship and the current at each of the interfaces in the unsymmetric current controlling element of FIG. 5.

FIG. 7 is a view showing a circuit of a nonvolatile memory device according to Embodiment 1 of the present invention, in which FIG. 7(a) is a circuit diagram of the nonvolatile memory device according to Embodiment 1 of the present invention, and FIG. 7(b) is an equivalent circuit diagram showing a current flowing through a selected cell and unselected cells in a case where the selected cell of FIG. 7(a) is used as a reference.

FIG. 8 is a table showing an example of metals and semiconductor layers which are selectable.

FIG. 9 is a process step view showing a manufacturing method of a nonvolatile memory device 10 of this embodiment, in which FIG. 9(a) is a view showing a step of forming first wires on a substrate, FIG. 9(b) is a view showing a step of forming a first interlayer insulating layer, first contact plugs and second contact plugs; FIG. 9(c) is a view showing a step of forming resistance variable elements and FIG. 9(d) is a view showing a step of forming a second interlayer insulating layer, third contact plugs and fourth contact plugs.

FIG. 10(a) is a view showing a step of forming current controlling elements, FIG. 10(b) is a step of forming a third interlayer insulating layer, fifth contact plugs and sixth contact plugs, and FIG. 10(c) is a view showing a step of forming second wires and lead-out wires.

FIG. 13 is a process step view showing a manufacturing method of major constituents of a nonvolatile memory device 30 of this embodiment, in which FIG. 13(a) is a view showing a step of forming a conductive layer, a semiconductor layer and a conductive layer over the second interlayer insulating layer in this order, FIG. 13(b) is a view showing a step of forming a resist pattern over the conductive layer, FIG. 13(c) is a view showing a step of forming the upper electrodes of current controlling elements, and FIG. 13(d) is a view showing a step of forming a resist pattern on the semiconductor layer using a desired mask, and FIG. 13(e) is a view showing a step of forming the semiconductor layers and the lower electrodes of the current controlling elements.

FIG. 15 is a process step view showing the manufacturing method of a nonvolatile memory device 40 of this embodiment, in which FIG. 15(a) is a view showing a step of forming first wires and a first conductive layer on the substrate, FIG. 15(b) is a view showing a step of forming the first interlayer insulating layer, through-holes and first resistance variable layers, FIG. 15(c) is a view showing a step of filling a material of second resistance variable layers, FIG. 15(d) is a view showing a step of forming first intermediate electrodes and FIG. 15(e) is a view showing a step of forming first contact plugs.

FIG. 16 is a process step view showing the manufacturing method of the nonvolatile memory device 40 of this embodiment, in which FIG. 16(a) is a view showing a step of forming a first semiconductor layer, a second conductive layer, second wires and a third conductive layer, FIG. 16(b) is a view showing a step of forming a second interlayer insulating layer, through-holes and third resistance variable layers, and FIG. 16(c) is a view showing a step of filling a material of fourth resistance variable layers.

FIG. 17 is a process step view showing the manufacturing method of the nonvolatile memory device 40 of this embodiment, in which FIG. 17(a) is a view showing a step of forming second intermediate electrodes, FIG. 17(b) is a view showing a step of forming second contact plugs and FIG. 17(c) is a view showing a step of forming a second semiconductor layer, a fourth conductive layer and third wires.

FIG. 18 is a process step view showing the manufacturing method of the nonvolatile memory device 40 of this embodiment, in which FIG. 18(a) is a view showing a step of forming a third interlayer insulating layer, third contact plugs 223 and fourth contact plugs, and FIG. 18(b) is a view showing a step of forming first lead-out wires 225 and second lead-out wires 226.

EMBODIMENTS FOR CARRYING OUT THE INVENTION

Figure 1:
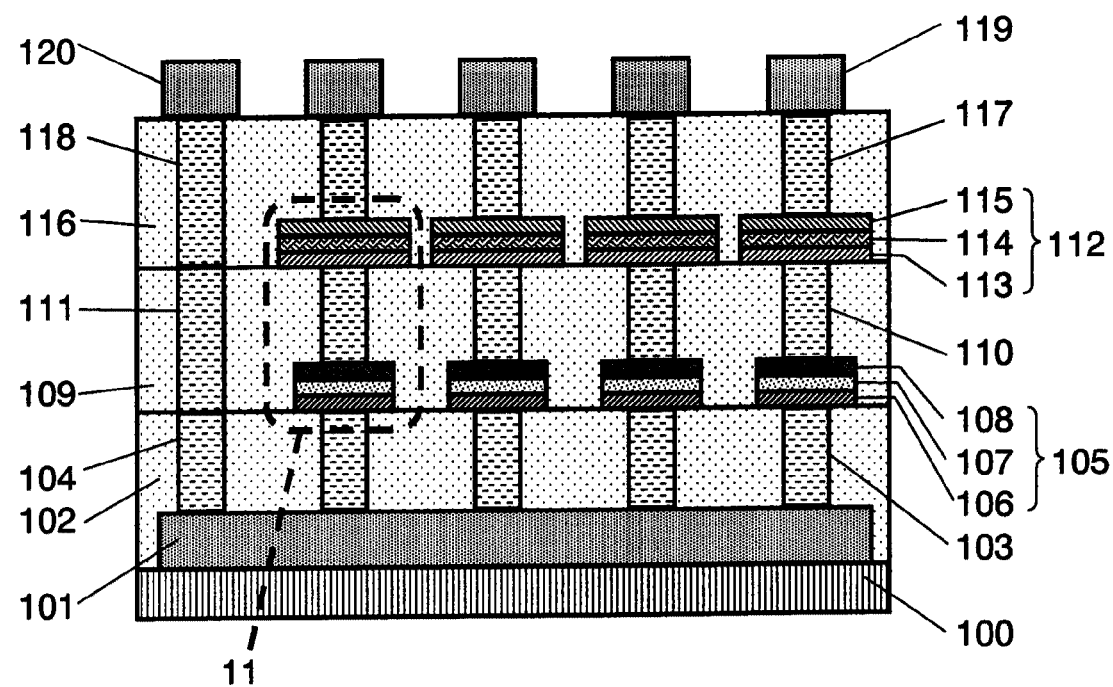
FIG. 1 is a cross-sectional view showing an exemplary schematic configuration of a nonvolatile memory element and a nonvolatile memory device according to Embodiment 1 of the present invention.

Hereinafter, embodiments of the present invention will be described with reference to the drawings. Throughout the drawings, the constituents designated by the same reference numerals will not be described repetitively in some cases. In addition, in the drawings, the constituents are schematically depicted for easier understanding. Therefore, the shapes and scales of the constituents are not depicted correctly.

Embodiment 1

[Schematic Configuration]

Figure 2:
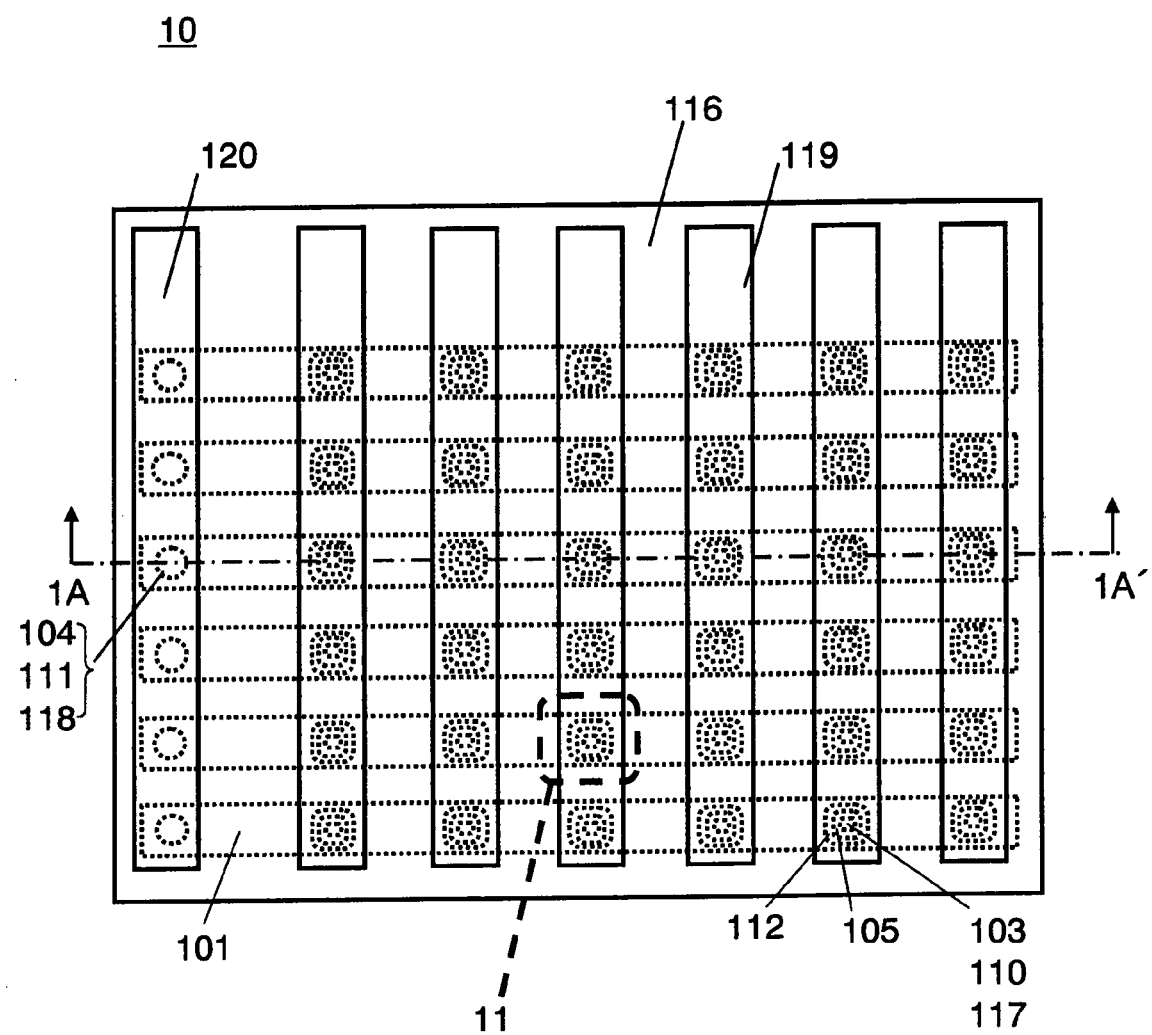
FIG. 2 is a top view showing an exemplary schematic configuration of the nonvolatile memory element and the nonvolatile memory device according to Embodiment 1 of the present invention.

FIG. 1 is a cross-sectional view showing an exemplary schematic configuration of a nonvolatile memory element and a nonvolatile memory device according to Embodiment 1 of the present invention. FIG. 2 is a top view showing an exemplary schematic configuration of a nonvolatile memory element and a nonvolatile memory device according to Embodiment 1 of the present invention. The cross-sectional view which is taken in the direction of arrows along one-dotted line 1A-1A' of FIG. 2, corresponds to FIG. 1.

As shown in FIG. 1, a nonvolatile memory device 10 of this embodiment includes in a schematic configuration, a substrate 100, a plurality of first wires 101 which are formed to extend in parallel with each other in a first direction (rightward and leftward direction in FIGS. 1 and 2) on a main surface of the substrate 100, a plurality of second wires 119 which are formed above the plurality of first wires 101 such that the plurality of second wires 119 extend in parallel with each other in a second direction (direction perpendicular to the depth direction of sheet of FIG. 1 and an upward and downward direction in FIG. 2), within a plane parallel to the main surface of the substrate 100 and three-dimensionally cross the plurality of first wires 101, respectively, and nonvolatile memory elements 11 which are provided to respectively correspond to three-dimensional cross-points of the first wires 101 and the second wires 119 such that the nonvolatile memory elements 11 connect (electrically connect, hereinafter the same occurs) the first wires 101 to the second wires 119, respectively.

Each nonvolatile memory element 11 includes a resistance variable element 105, a current controlling element 112, and a third contact plug 110 connecting the resistance variable element 105 to the current controlling element 112.

Each resistance variable element 105 includes a lower electrode 106 (first electrode), an upper electrode 108 (second electrode) and a resistance variable layer 107 provided between the lower electrode 106 and the upper electrode 108. The lower electrode 106 is physically in contact with the resistance variable layer 107, while the upper electrode 108 is physically in contact with the resistance variable layer 107.

Each current controlling element 112 includes a lower electrode 113 (third electrode), an upper electrode 115 (fourth electrode) and a semiconductor layer 114 provided between the lower electrode 113 and the upper electrode 115. The lower electrode 113 is physically in contact with the semiconductor layer 114, while the upper electrode 115 is physically in contact with the semiconductor layer 114.

A first interlayer insulating layer 102 is formed over the substrate 100 to cover the first wires 101. A plurality of resistance variable elements 105 are formed on the first interlayer insulating layer 102 such that the resistance variable elements 105 are arranged at equal intervals on the first electrode wires 101 when viewed in a stacking direction (upward direction in FIG. 1: hereinafter thickness direction) of the first wires 101. The first wires 101 are connected to the lower electrodes 106 of the resistance variable elements 105 located above the first wires 101 via first contact plugs 103 penetrating the first interlayer insulating layer 102, respectively.

A second interlayer insulating layer 109 is formed over the first interlayer insulating layer 102 to cover the resistance variable elements 105. A plurality of current controlling elements 112 are formed on the second interlayer insulating layer 109 such that the current controlling elements 112 overlap with the resistance variable elements 105 when viewed in the thickness direction. Each third contact plug 110 connects (short-circuits) the upper electrode 108 of the resistance variable element 105 to the lower electrode 113 of the current controlling element 112 such that the resistance variable layer 107 and the semiconductor layer 114 do not intervene between them.

A third interlayer insulating layer 116 is formed over the second interlayer insulating layer 109 to cover the current controlling elements 112. Second wires 119 are formed on the third interlayer insulating layer 116 such that the second wires 119 cross the first electrode wires perpendicularly to the first electrode wires and overlap with the resistance variable elements 105 and the current controlling elements 112, respectively when viewed in a thickness direction. The second wires 119 are connected to the upper electrodes 115 of the current controlling elements 112 located below the second wires 119 via fifth contact plugs 117 penetrating the third interlayer insulating layer 116, respectively.

Lead-out wires 120 are formed on the third interlayer insulating layer 116 such that the lead-out wires 120 are located outside the section where the nonvolatile memory elements 11 are arranged when viewed in the thickness direction and extend in parallel with the second wires 119, i.e., in a second direction. Second contact plugs 104 penetrate the first interlayer insulating layer 102, fourth contact plugs 111 penetrate the second interlayer insulating layer 109 and sixth contact plugs 118 penetrate the third interlayer insulating layer 116 to connect the first wires 101 to the lead-out wires 120, respectively. In other words, the second contact plug 104, the fourth contact plug 111 and the sixth contact plug 118 are stacked together in this order and interconnected to form a stacked contact for connecting the first wire 101 to the lead-out wire 120.

The first wires 101, the second wires 119 and the lead-out wires 120 comprise, for example, aluminum. The first interlayer insulating layer 102, the second interlayer insulating layer 109, and the third interlayer insulating layer 116 comprise, for example, silicon oxide. The first contact plugs 103, the second contact plugs 104, the third contact plugs 110, the fourth contact plugs 111, the fifth contact plugs 117 and the sixth contact plugs 118 comprise, for example, tungsten.

In such a configuration, a nonvolatile memory device is implemented to include so-called a cross-point memory cell array in which the nonvolatile memory elements 11 are arranged at respective three-dimensional cross-points of the first wires 101 and the second wires 119 which three-dimensionally cross each other, when the nonvolatile memory device 10 is viewed in the thickness direction.

[Configuration of Resistance Variable Element]

In the resistance variable element 105 of this embodiment, the resistance variable layer 107 contains an oxygen-deficient transition metal oxide (transition metal oxide having less oxygen content [atom ratio: ratio of oxygen atoms to total number of atoms] than a stoichiometric oxide). Preferably, the resistance variable layer 107 comprises a transition metal oxide made of oxygen-deficient oxide of tantalum ($TaO_x$: $0<x<2.5$) or oxygen-deficient oxide of hafnium ($HfO_x$: $0<x<2$). More preferably, the resistance variable layer 107 comprises oxygen-deficient oxide of tantalum or oxygen-deficient oxide of hafnium.

These resistance variable layers were invented to provide a nonvolatile memory element which has a reversible and stable rewrite characteristic and makes use of a resistance changing phenomenon and are described in detail in the associated Japanese Patent Application No. 2007-267583 and the associated Japanese Patent Application No. 2007-267584, respectively.

In the resistance variable element 105 of the present invention, when the standard electrode potential of a material (first material) making up the lower electrode 106 is V1, the standard electrode potential of a material (second material) making up the upper electrode 108 is V2, and the standard electrode potential of a transition metal (in a case where the oxidation number of this transition metal is zero) in the oxygen-deficient transition metal oxide included in the resistance variable layer 107 is Vt, Vt<V2 and V1<V2 are satisfied.

Since Vt<V2 is satisfied, the material of the upper electrode 108 is oxidated less easily than the material of the resistance variable layer 107. As a result, the material of the upper electrode 108 is not oxidated and reduced but the material of the resistance variable layer 107 is oxidated and reduced when the electrons migrate at the interface between the upper electrode 108 and the resistance variable layer 107. This causes a change in an oxidation state of the resistance variable layer 107, and results in a resistance changing phenomenon.

Since V1<V2 is satisfied, redox reactions at the electrode interface occur preferentially at the upper electrode 108 side. In other words, the resistance changing phenomenon is allowed to occur only at the interface of the upper electrode side.

When the resistance variable element 105 is changed to the high-resistance state (reset operation is performed), a positive voltage (positive electric signal) is applied to the upper electrode 108 on the basis of the lower electrode 106, and a current flows from the upper electrode 108 to the lower electrode 106. Thereby, at the upper electrode side, electrons migrate from the resistance variable layer 107 to the electrode. As a result, the material of the resistance variable layer 107 is oxidated and the resistance value increases.

When the resistance variable element 105 is changed to the low-resistance state (set operation is performed), a negative voltage (negative electric signal) is applied to the upper electrode 108 on the basis of the lower electrode 106, and a current flows from the lower electrode 106 to the upper electrode 108. Thereby, at the upper electrode side, electrons migrate from the electrode to the resistance variable layer 107. As a result, the material of the resistance variable layer 107 is reduced and the resistance value decreases.

As the lower electrode 106, for example, tantalum nitride (TaN) may be used. As the upper electrode 108, for example, platinum (Pt) may be used. When the standard electrode potential of the lower electrode is V1, V1=0.48 (standard electrode potential of tantalum nitride). When the standard electrode potential of the upper electrode is V2, V2=1.18V (standard electrode potential of platinum).

When the resistance variable layer 107 is tantalum oxide, Vt=−0.6V (standard electrode potential of tantalum). Therefore, Vt<V2 and V1<V2 are satisfied.

When the resistance variable layer 107 is hafnium oxide, Vt=−1.55V (standard electrode potential of hafnium). Therefore, Vt<V2 and V1<V2 are satisfied.

The thickness of the resistance variable layer is set to, for example, 30 nm.

[Characteristic of Resistance Variable Element]

Figure 3:
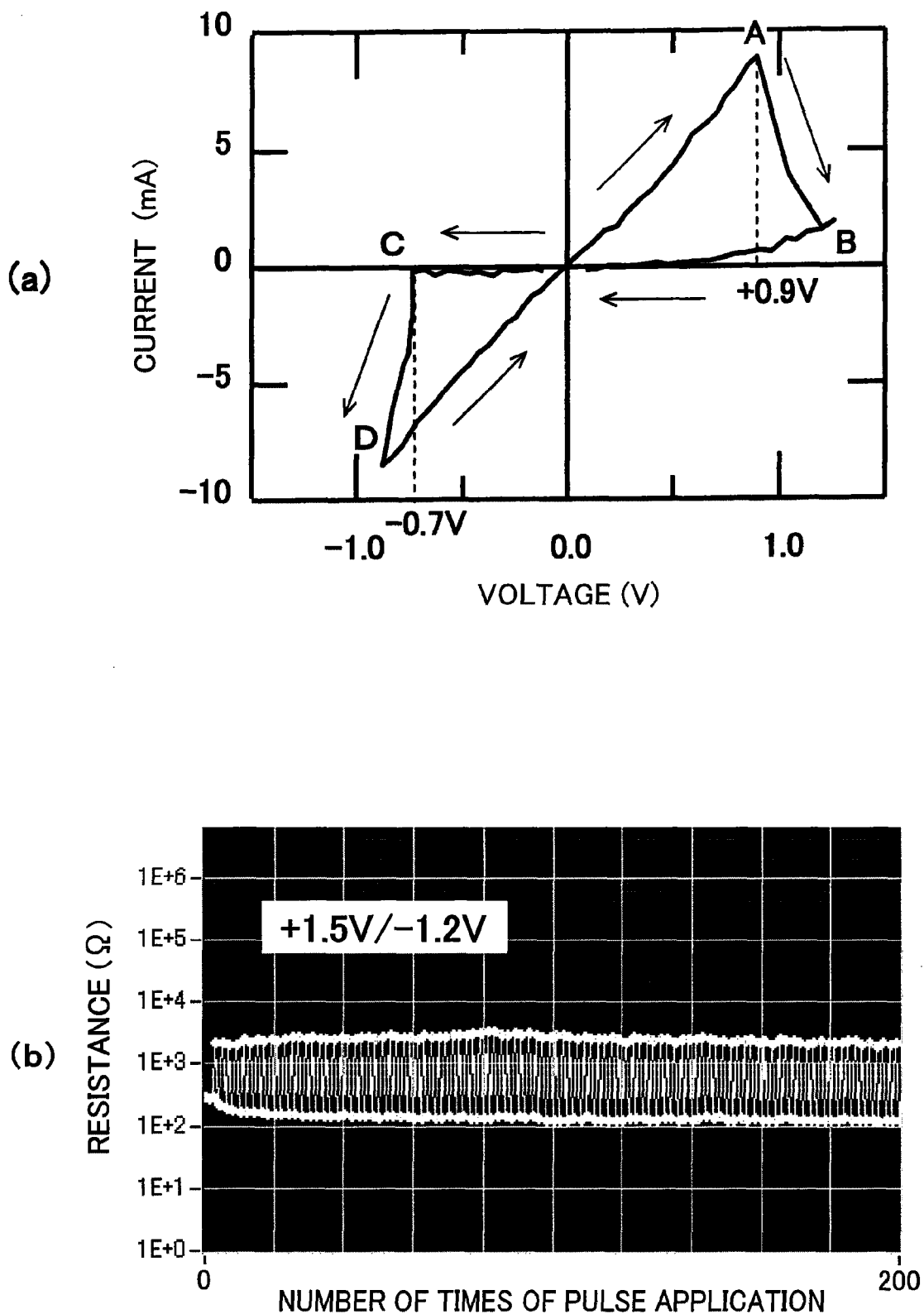

Hereinafter, the characteristic of the resistance variable element 105 in a case where tantalum oxide (thickness: about 30 nm) is used as the material of the resistance variable layer 107 will be described. FIG. 3 is a view showing a characteristic of a resistance variable element, in which FIG. 3(*a*) is a graph showing an exemplary current-voltage characteristic of the resistance variable element 105 and FIG. 3(*b*) is a graph showing an exemplary change in a resistance value in a case where electric pulses are applied to the resistance variable element 105.

As shown in FIG. 3(*a*), when a positive voltage is applied to the upper electrode 108 on the basis of the lower electrode 106 in such a manner that the absolute value of the voltage gradually increases, the resistance variable element 105 changes from the low-resistance state to the high-resistance state at point A (attains the high-resistance state). At point A, the voltage is about +0.9V and the current is about +9 mA. Then, when a negative voltage is applied to the upper electrode 108 on the basis of the lower electrode 106 with respect to a resistance variable element in a high-resistance state in such a manner that the absolute value of the voltage gradually increases, the resistance variable element 105 changes from the high-resistance state to the low-resistance state at point C (attains the low-resistance state). At point C, the voltage is about −0.7V and the current is about −0.1 mA.

The high-resistance state refers to a state in which the resistance value (resistance value between the lower electrode 106 and the upper electrode 108) is higher than the resistance value corresponding to the low-resistance state. Conversely, the low-resistance state refers to a state in which the resistance value is lower than the resistance value corresponding to the high-resistance state.

To change the resistance variable element 105 to the high-resistance state, it is necessary to flow a current of about 9 mA so that the point A is reached. On the other hand, to change the resistance variable element 105 to the low-resistance state, it is sufficient to flow a current which is as low as about 0.1 mA so that the point C is reached. In other words, the resistance variable element 105 exhibits a characteristic in which a current required to attain the high-resistance state is higher than a current required to attain the low-resistance state.

FIG. 3(*b*) shows an example of a measurement result of the resistance value (resistance value between the lower electrode 106 and the upper electrode 108) of the resistance variable element 105 in a case where an electric pulse (electric signal) with a voltage of +1.5V and a pulse width of 100 nsec and an electric pulse with a voltage of −1.2V and a pulse width of 100 nsec are applied alternately to the upper electrode 108 on the basis of the lower electrode 106 between the lower electrode 106 and the upper electrode 108. As shown in FIG. 3(*b*), when the electric pulse with a voltage of +1.5V is applied, the resistance value reaches about 1200~1500Ω (high-resistance state). On the other hand, when the electric pulse of −1.2V is applied, the resistance value reaches about 150Ω (low-resistance state). The resistance value is about one-digit different between the high-resistance state and the low-resistance state. Thus, the resistance variable element 105 exhibits a characteristic in which the absolute value of the voltage of the electric pulse applied to attain the high-resistance state is larger than the absolute value of the voltage of the electric pulse applied to attain the low-resistance state, when the resistance variable element 105 repeats stable resistance change.

As explained above, the resistance variable element 105 has an unsymmetric characteristic with respect to the polarity.
[Configuration of Current Controlling Element]

The current controlling element 112 having the above configuration is composed of the lower electrode 113 comprising tungsten, the semiconductor layer 114 comprising n-type semiconductor silicon, and the upper electrode 115 comprising tantalum nitride. The thickness of the semiconductor layer 114 is set to, for example, 3~20 nm. The work function of tungsten is 4.6 eV. The electron affinity of silicon is 3.78 eV. The work function of tantalum nitride is 4.76 eV. When the work function of the lower electrode is $\Phi 1$, the electron affinity of the semiconductor layer is $\Phi s$, and the work function of the upper electrode is $\Phi 2$, $\chi s < \Phi 1 < \Phi 2$ is satisfied. With such a configuration, it is possible to implement a bidirectional current controlling element (MSM diode element) having an unsymmetric characteristic.
[Characteristic of Current Controlling Element]

The current controlling element 112 is a MSM diode utilizing a Schottky barrier formed at an interface between metal and semiconductor. The current controlling element 112 has an unsymmetric current-voltage characteristic according to the voltage polarity. To be specific, the current controlling element 112 has a current-voltage characteristic in which when a current flowing when a voltage whose absolute value is a first value as a desired value which is larger than 0 and smaller than a predetermined voltage value and whose polarity is positive (first polarity) is applied to the upper electrode 115 on the basis of the lower electrode 113 is a first current and a current flowing when a voltage whose absolute value is the first value and whose polarity is negative (second polarity different from the first polarity) is applied to the upper electrode 115 on the basis of the lower electrode 113 is a second current, the first current is higher than the second current. In other words, the current controlling element 112 has a higher current drivability when the voltage with the first polarity is applied than when the voltage with the second polarity is applied. The current controlling element 112 has a characteristic in which, with respect to a desired value a which satisfies 0<a<1 (i.e., in a whole range of 0<a<1), a current flowing when the voltage of +aV is applied to the upper electrode on the basis of the lower electrode is higher than a current flowing when the voltage of −aV is applied to the upper electrode on the basis of the lower electrode, when the predetermined voltage value is, for example, 1V.

Figure 4:
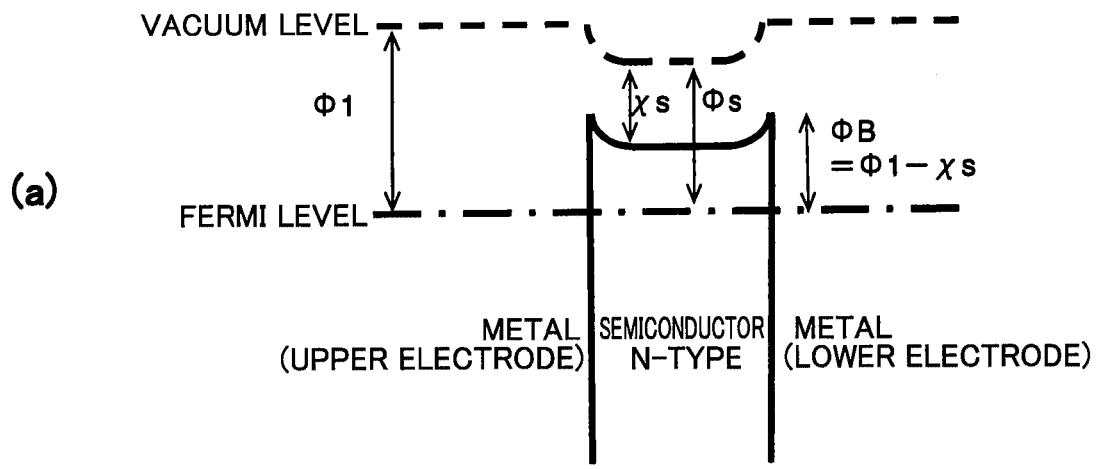
Figure 4:
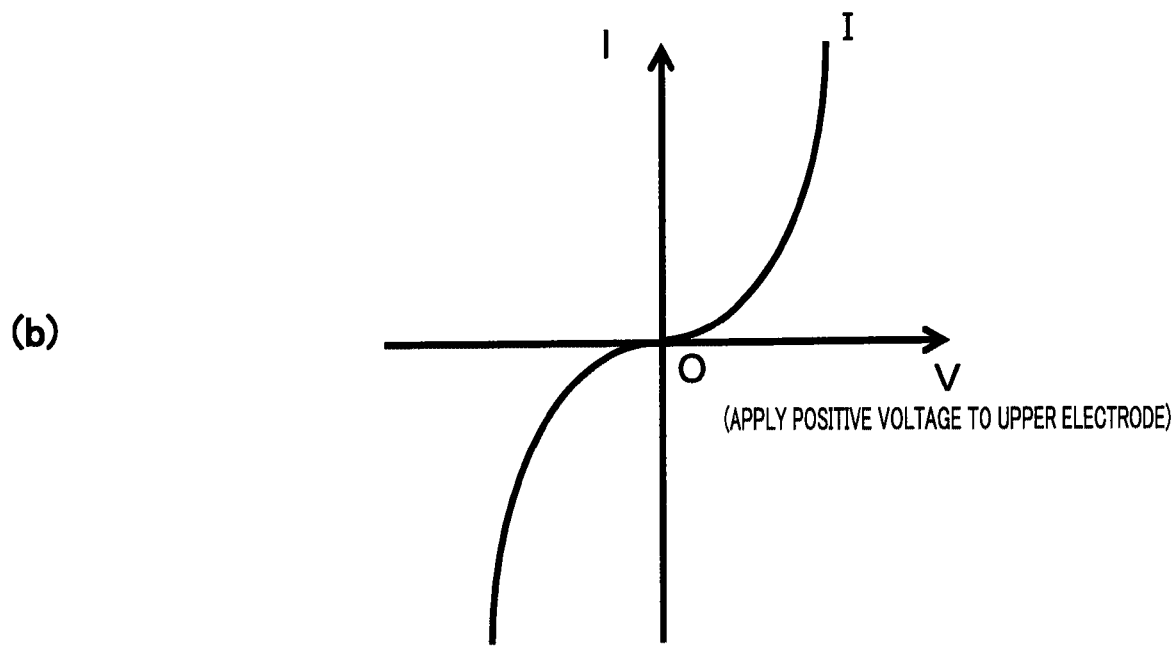

As used herein, the current controlling element refers to an element having a current-voltage characteristic (monotonous increase characteristic) in which as the absolute value of the applied voltage is larger, the absolute value of the flowing current is larger regardless of whether the polarity is the first polarity or the second polarity, and a current-voltage characteristic (nonlinear characteristic) in which as the absolute value of the applied voltage is larger, a change rate (slope: change amount of the absolute value of the current/change amount of the absolute value of the voltage) of the current with respect to the voltage is larger regardless of whether the polarity is the first polarity or the second polarity, as depicted in FIG. 4(*a*) and FIG. 4(*b*) described later.

The predetermined voltage value may be specifically defined as follows. The resistance variable element 105 and the current controlling element 112 are connected in series to constitute the nonvolatile memory element 11. The predetermined voltage value may be defined as a larger one of the absolute values of the voltages (voltage applied to the current controlling element 112 when the nonvolatile memory element 11 changes to the high-resistance state and voltage applied to the current controlling element 112 when the nonvolatile memory element 11 changes to the low-resistance state) applied between the lower electrode 113 and the upper electrode 115 of the current controlling element 112 when the voltage is applied between the both ends of the nonvolatile memory element 11 so that a voltage required to change the resistance variable element 105 to the high-resistance state or to the low-resistance state is applied between the lower electrode 106 and the upper electrode 108 of the resistance variable element 105. With such a configuration, the current controlling element 112 properly restricts the current when the resistance state of the resistance variable element 105 is changed in an actual operation. A specific example of the predetermined voltage value may be 3.0[V] when the above mentioned resistance variable element (lower electrode: tantalum nitride, upper electrode: platinum, resistance variable layer: tantalum oxide, thickness of resistance variable layer: 30 nm, shape in a thickness direction: square of 0.5 μm× 0.5 μm) and the above mentioned current controlling element (lower electrode: tungsten, upper electrode: tantalum nitride, semiconductor layer: silicon, thickness of semiconductor layer: 10 nm, shape in a thickness direction: square of 0.5 μm×0.5 μm).

To explain the above characteristic, firstly, a current controlling element having a symmetric current-voltage characteristic according to a polarity will be described in brief. This current controlling element has a structure in which upper and lower electrodes comprise the same metal and n-type semiconductor is sandwiched between these electrodes.

FIG. 4 is a view of the current controlling element having the symmetric current-voltage characteristic, in which FIG. 4(*a*) is a view of an energy band in a thickness direction of the current controlling element including the n-type semiconductor, the upper and lower electrodes which comprise the same metal and sandwich the n-type semiconductor, and FIG. 4(*b*) is a graph schematically showing the current-voltage characteristic of the current controlling element of FIG. 4(*a*).

In FIG. 4(*a*), $\Phi 1$ indicates a work function of the metal which is the electrode material, $\Phi s$ indicates a work function of the n-type semiconductor, and $\chi s$ indicates electron affinity of the n-type semiconductor. A Schottky barrier is formed at the interface between the metal (electrode) and the n-type semiconductor. When the height of the Schottky barrier is $\Phi B$, $\Phi B = \Phi 1 - \chi s$ is satisfied. In a balanced state, no current flows, and therefore the Fermi level of the metal is equal to the Fermi level of the n-type semiconductor. Electron density at the center portion of the semiconductor layer which is far from the interface between the metal and the n-type semiconductor is unchanged before and after the contact. Therefore, the energy band is curved in a downward direction.

Theoretically, a current J (current flowing from the metal to the semiconductor) flowing through the Schottky barrier satisfies the following formula (1):

$$J \propto \exp(-\Phi B/kT)\exp[(qV/kT)-1] \quad (1)$$

where V indicates a potential of the metal on the basis of the semiconductor, q indicates an electric charge of electrons, k indicates a Boltzmann constant, and T indicates an absolute temperature.

In other words, the current flows from the metal to the semiconductor (electrons migrate from the semiconductor to the metal) when the voltage (forward bias voltage: V>0) is applied in such a manner that the potential of the metal is higher than the potential of the semiconductor). As the potential of the semiconductor decreases, the potential of the electrons inside the semiconductor rises. The height of the barrier which is viewed from the semiconductor is relatively lowered, allowing the electrons to more easily travel beyond the barrier. Therefore, when the forward bias voltage is applied, the current increases exponentially as the absolute value of the voltage is larger.

On the other hand, when the voltage (reverse bias voltage: V<0) is applied in such a manner that the potential of the metal is lower than the potential of the semiconductor, the current flows from the semiconductor to the metal (electrons migrate from the metal to the semiconductor). As the potential of the semiconductor rises, the potential of the electrons inside the semiconductor decreases. The electrons must travel beyond the barrier which is viewed from the metal, to migrate from the metal to the semiconductor. However, the height of the barrier which is viewed from the metal does not change even though the voltage is applied. Therefore, when the reverse bias voltage is applied, the current converges to a certain value as the absolute value of the voltage is larger.

If the absolute value of the voltage applied is larger in the MSM diode, the slope of the Schottky barrier at the interface which is reversely biased becomes steep, so that the barrier is thinner. If the absolute value of the voltage exceeds a certain level, then the electrons easily travel beyond the barrier because of a tunneling effect or the like. In other words, when the absolute value of the voltage is above a certain level, then an influence of the barrier at the interface reversely biased may be negligible.

In summary, the MSM diode has a feature that it exhibits a large resistance value because of the influence of the Schottky barrier generated at the interface reversely biased, when the absolute value of the voltage is below a certain level, but the resistance value drastically decreases when the absolute value of the voltage exceeds a certain level.

As shown in FIG. 4($b$), the current-voltage characteristic is symmetric with respect to the polarity and non-linear with respect to the voltage. The fact that the current-voltage characteristic is symmetric with respect to the polarity means that the absolute value of the current is equal when the absolute value of the applied voltage V is equal. The fact that the current-voltage characteristic is non-linear with respect to the voltage means that not a substantial current flows in a range where the absolute value of the applied voltage is smaller, but a higher current flows in a range where the absolute value of the applied voltage is larger (curve I). In other words, as the absolute value of the applied voltage is larger, the slope ($\Delta I/\Delta V$) is larger.

Next, the current controlling element 112 having an unsymmetric current-voltage characteristic according to the polarity in this embodiment will be described. In this embodiment, the current controlling element 112 has a structure in which the lower and upper electrodes comprise different metals and sandwich the n-type semiconductor.

Figure 5:
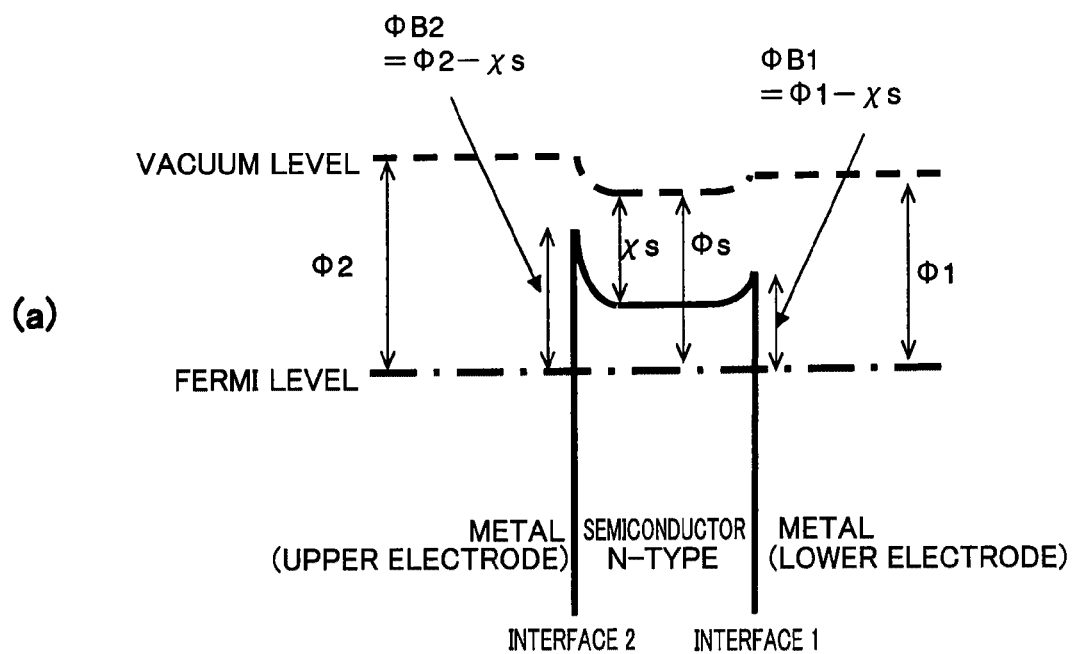
Figure 5:
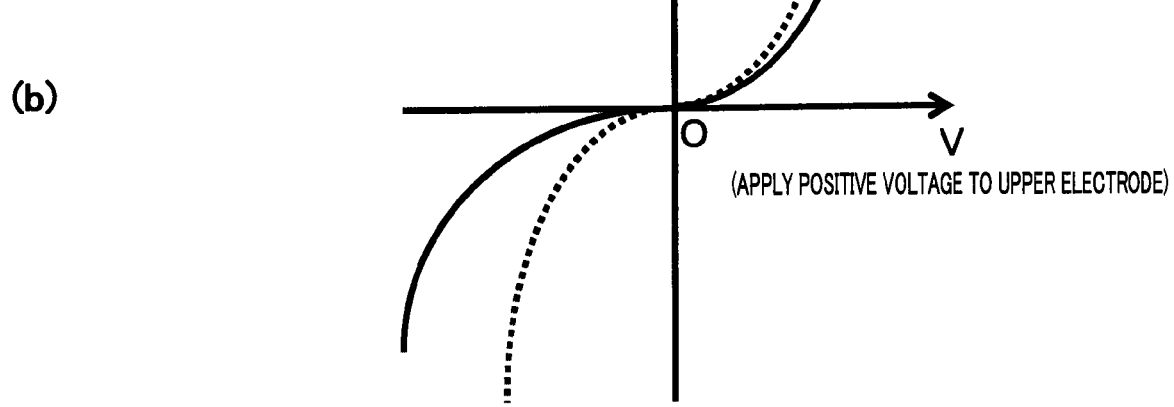

FIG. 5 is a view of a current controlling element having an unsymmetric current-voltage characteristic, in which FIG. 5($a$) is a view of an energy band in a thickness direction of the current controlling element 112 (current controlling element including the n-type semiconductor, the lower and upper electrodes which comprise different metals and sandwich the n-type semiconductor), and FIG. 5($b$) is a graph schematically showing the current-voltage characteristic of the current controlling element of FIG. 5($a$).

In FIG. 5($a$), the material of the lower electrode is metal 1, the material of the upper electrode is metal 2, $\Phi 1$ indicates a work function of the metal 1, $\Phi 2$ indicates a work function of the metal 2 ($\Phi 2 > \Phi 1$), $\Phi s$ indicates a work function of the n-type semiconductor and $\chi s$ indicates electron affinity of the n-type semiconductor. Schottky barriers with different heights are formed at the interface between the lower electrode and the n-type semiconductor and at the interface between the upper electrode and the n-type semiconductor. When the height of the barrier at the lower electrode side is $\Phi B1$ and the height of the barrier at the upper electrode side is $\Phi B2$, $\Phi B1 = \Phi 1 - \chi s$ and $\Phi B2 = \Phi 2 - \chi s$ are satisfied. Because of $\Phi 2 > \Phi 1$, the barrier at the upper electrode side is higher than the barrier at the lower electrode side. For this reason, a current flows less easily (current drivability is lower) in a case where the upper electrode side is reversely biased (a negative voltage is applied to the upper electrode on the basis of the lower electrode) than in a case where the upper electrode side is forwardly biased (a positive voltage is applied to the upper electrode on the basis of the lower electrode).

As shown in FIG. 5($b$), the current-voltage characteristic is unsymmetric with respect to the polarity and non-linear with respect to the voltage. The current-voltage characteristic is similar to that of the curve I of FIG. 4($b$) in that not a substantial current flows in a range where the absolute value of the applied voltage is smaller, but a higher current flows in a range where the absolute value of the applied voltage is larger. However, if the absolute value of the voltage is equal, a current flowing by applying the positive voltage to the upper electrode on the basis of the lower electrode is higher than a current flowing by applying the negative voltage to the upper electrode on the basis of the lower electrode (curve II).

When the absolute value of a portion (negative portion) of V<0 and I<0 and a portion (positive portion) of V>0 and I>0 in the curve II are plotted, the curve of the negative portion and the curve of the positive portion do not cross each other in at least a range in which a voltage is larger than 0 and smaller than a predetermined voltage value (e.g., 1V). Therefore, a relationship is satisfied, in which a current flowing by applying a voltage of +aV to the upper electrode on the basis of the lower electrode when a desired value which is larger than 0V and smaller than the predetermined voltage value is a is always higher than a current flowing by applying a voltage of −aV to the upper electrode on the basis of the lower electrode.

In general, a current flowing through a MSM diode element is restricted by a reversely biased interface in a range in which the absolute value of the applied voltage is below a certain level. Therefore, the current flowing through the MSM diode element may be explained using a model in which two Schottky diodes are connected in series such that they face different directions. Now, a mechanism in which the current-voltage characteristic of the current controlling element 112 is unsymmetric will be described using the model.

Figure 6:
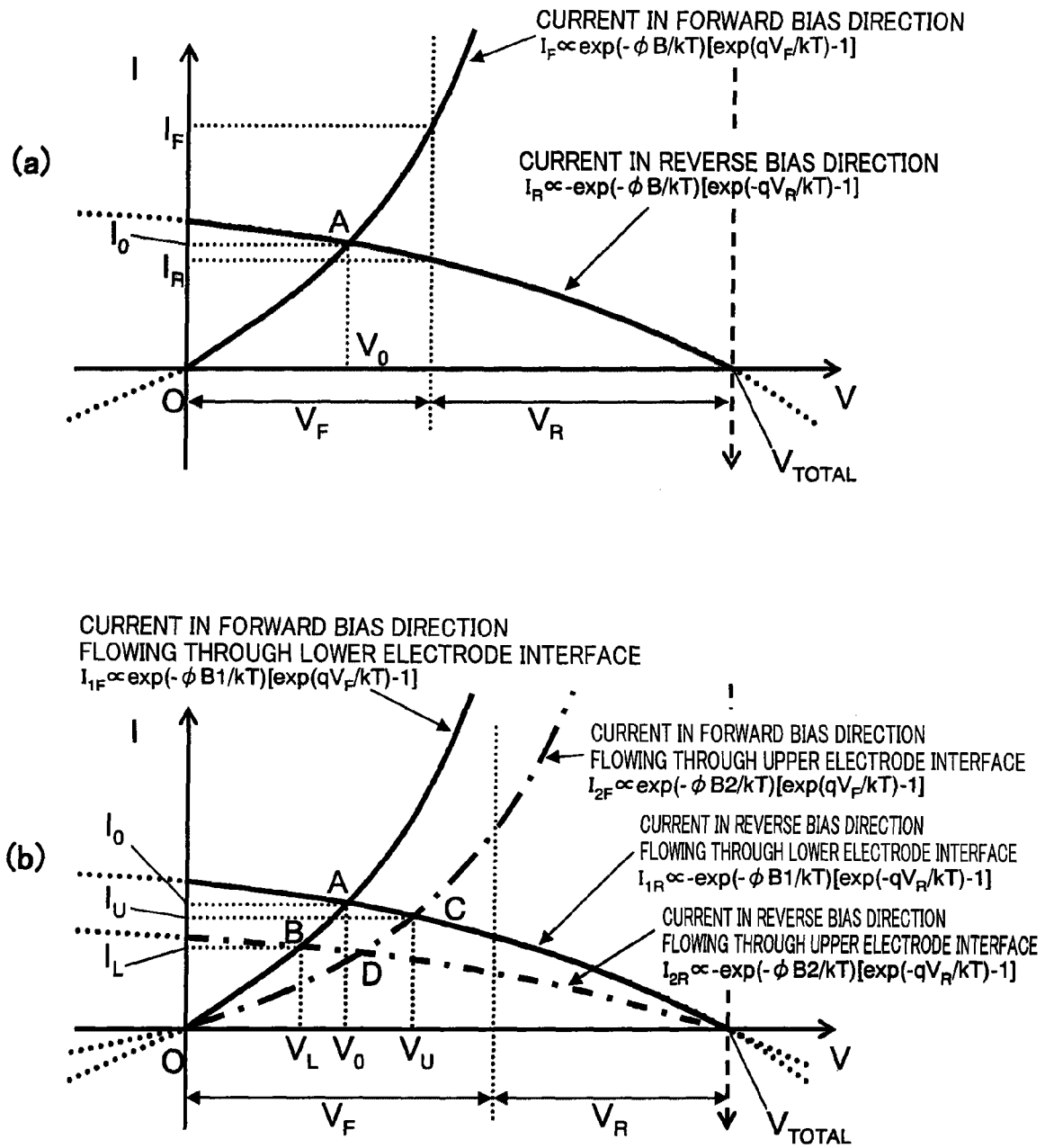

FIG. 6 is a view showing a voltage division relationship and a current at each of interfaces in the current controlling element, in which FIG. 6($a$) is a view showing a voltage division relationship and a current at each of the interfaces in the symmetric current controlling element of FIG. 4 and FIG. 6($b$) is a view showing a voltage division relationship and a current at each of the interfaces in the unsymmetric current controlling element of FIG. 5.

It is assumed that a positive voltage $V_{TOTAL}$ (>0) is applied to the upper electrode on the basis of the lower electrode in the symmetric current controlling element shown in FIG. 6($a$). In this case, at the interface (hereinafter referred to as the upper electrode interface) between the semiconductor layer and the upper electrode, electrons migrate from the semiconductor to the metal, and therefore the forward bias occurs. A current (current in a forward bias direction) $I_F$ (>0) flowing through the upper electrode interface satisfies the following formula (2), when the voltage allocated to the upper electrode interface is $V_F$ (>0):

$$I_F \propto \exp(-\Phi B/kT)\exp[(qV_F/kT)-1] \quad (2)$$

On the other hand, at the interface (hereinafter referred to as a lower electrode interface) between the semiconductor layer and the lower electrode, electrons migrate from the metal to the semiconductor layer, and therefore a reverse bias occurs. A current (current in a reverse bias direction) $I_R$ (>0) flowing through the lower electrode interface satisfies the following formula (3) when a voltage allocated to the lower electrode interface is $V_R$ (>0):

$$I_R \propto -\exp(-\Phi B/kT)\exp[(-qV_R/kT)-1] \quad (3)$$

In the same device, since an equal current flows through the both interfaces, an actual current and an actual voltage converge at an intersection A of the two graphs. When the current at the intersection A is $I_O$ and the voltage at the intersection A is $V_O$, $I_F$ in the formula (2) and $I_R$ in the formula (3) are equal to $I_O$, when $V_O = V_F$ and $V_F + V_R = V_{TOTAL}$ are satisfied.

It may be considered that the same occurs when a negative voltage $-V_{TOTAL}$ is applied to the upper electrode on the basis of the lower electrode. In this case, a flowing current is $-I_O$, a voltage allocated to the upper electrode interface is $-V_R$, and a voltage allocated to the lower electrode interface is $-V_F$. In other words, in the symmetric current controlling element, the magnitude of the current is equal if the absolute value of the applied voltage is equal (see curve I in FIG. 5(b)).

FIG. 6(b) is a view showing a voltage division relationship and a current at each of the interfaces in the unsymmetric current controlling element of FIG. 5.

It is assumed that a positive voltage $V_{TOTAL}$ is applied to the upper electrode on the basis of the lower electrode in the unsymmetric current controlling element. In this case, also, a forward bias occurs at the upper electrode interface and a reverse bias occurs at the lower electrode interface. A current $I_{2F}$ (>0) in a forward bias direction flowing through the upper electrode interface satisfies the following formula (4) when a voltage allocated to the upper electrode interface is $V_{2F}$ (>0):

$$I_{2F} \propto \exp(-\Phi B2/kT)\exp[(qV_{2F}/kT)-1] \quad (4)$$

On the other hand, a current $I_{1R}$ (>0) in a reverse bias direction flowing through the lower electrode interface satisfies the following formula (5) when a voltage allocated to the lower electrode interface is $V_{1R}$ (>0):

$$I_{1R} \propto -\exp(-\Phi B1/kT)\exp[(-qV_{1R}/kT)-1] \quad (5)$$

An actual current and an actual voltage converge at an intersection C of the two graphs. When the current at the intersection C is $I_U$ and the voltage at the intersection C is $V_U$, $I_U$ ($=I_{2F}=I_{1R}$) satisfy the two above formulae (4) and (5), when $V_U = V_{2F}$ and $V_{2F} + V_{1R} = V_{TOTAL}$ are satisfied.

It is assumed that a negative voltage $-V_{TOTAL}$ is applied to the upper electrode on the basis of the lower electrode. In this case, a reverse bias occurs at the upper electrode interface because the metal (electrode) is at a lower potential than the semiconductor layer, while a forward bias occurs at the lower electrode interface because the metal (electrode) is at a higher potential than the semiconductor layer. A current $I_{2R}$ (>0) in a reverse bias direction flowing through the upper electrode interface satisfies the following formula (6) when a voltage allocated to the upper electrode interface is $V_{2R}$ (>0):

$$I_{2R} \propto -\exp(-\Phi B2/kT)\exp[(-qV_{2R}/kT)-1] \quad (6)$$

On the other hand, a current $I_{1F}$ (>0) in a forward bias direction flowing through the lower electrode interface satisfies the following formula (7) when a voltage allocated to the lower electrode interface is $V_{1F}$ (>0):

$$I_{1F} \propto \exp(-\Phi B1/kT)\exp[(qV_{1F}/kT)-1] \quad (7)$$

An actual current and an actual voltage converge at an intersection B of the two graphs. When the current at the intersection B is $I_L$ and the voltage at the intersection B is $V_L$, $I_L$ ($=I_{1F}=I_{2R}$) satisfy the above two formulae (6) and (7), when $V_L = V_{1F}$ and $V_{1F} + V_{2R} = V_{TOTAL}$ are satisfied.

The above description relates to a case where the applied voltage is relatively low and an influence of the reversely biased interface is not negligible. As the absolute value of the voltage is larger, then this influence may be negligible, and the resistance value of the current controlling element drastically decreases.

As can be seen from the Figure, $I_u > I_L$. A higher current flows when the positive voltage is applied to the upper electrode 115 on the basis of the lower electrode 113 (point C) than when the negative voltage is applied to the upper electrode 115 on the basis of the lower electrode 113 (point B) (see curve II of FIG. 5(b)). As should be appreciated, by forming the upper electrode 113 and the lower electrode 115 of metals, respectively, which are different from each other, the unsymmetric current controlling element 112 is obtained.

The specific characteristic of the current controlling element varies depending on the thickness of each layer, the size of the electrode surface, etc. The specific configuration of the current controlling element may be suitably selected so that a desired characteristic is attained based on the relationship with the resistance variable elements and other constituents, with reference to the above explanation. The specific design is easy to persons skilled in the art and therefore will not be described in detail.

[Feature of Nonvolatile Memory Device and Nonvolatile Memory Element of This Embodiment]

In the nonvolatile memory device 10 and the nonvolatile memory element 11 of this embodiment, the resistance variable element 105 and the current controlling element 112 are connected in series, and the voltage applied to the current controlling element 112 to change the resistance variable element 105 from the low-resistance state to the high-resistance state (attain the high-resistance state) has a polarity (first polarity) with which a higher current flows through the current controlling element when the absolute value of the voltage applied to the current controlling element is equal. To be specific, when the resistance variable element 105 is changed to the high-resistance state, a current flows from the upper electrode 108 to the lower electrode 106 in the resistance variable element 105 in this embodiment. The fact that the current flows in such a direction means that a voltage having a polarity with which the upper electrode 115 is placed at a positive potential on the basis of the lower electrode 113, is applied to the associated current controlling element 112. The polarity, with which the upper electrode 115 is placed at a positive potential on the basis of the lower electrode 113, is the polarity (first polarity) with which the current controlling element 112 has a higher current drivability.

In other words, the upper electrode 108 of the resistance variable element 105 is connected to the lower electrode 113 of the current controlling element 112 such that the resistance variable layer 107 and the semiconductor layer 114 do not intervene between the upper electrode 108 and the lower electrode 113 so that the direction of the voltage for changing the resistance variable layer 107 of the resistance variable element 105 from the low-resistance state to the high-resistance state conforms to the direction in which the current drivability of the current controlling element 112 is higher and the direction of the voltage for changing the resistance variable layer 107 of the resistance variable element 105 from the high-resistance state to the low-resistance state conforms to the direction in which the current drivability of the current controlling element 112 is lower.

In other words, the resistance variable element 105 is connected in series with the current controlling element 112 such that the direction of the current flowing through the resistance variable element 105 when the resistance variable element 105 is changed from the low-resistance state to the high-resistance state conforms to the direction of the first current flowing through the current controlling element 112.

In such a configuration, a high current required to attain the high-resistance state is obtained when the positive voltage is applied to the second wire 119 on the basis of the first wire 101 (when the resistance variable element 105 is changed to the high-resistance state). When the negative voltage is applied to the second wire 119 on the basis of the first wire 101 (when the resistance variable element 105 is changed to the low-resistance state), a minimum current required to attain the low-resistance state flows and the current controlling element 112 can prevent a high current from flowing abruptly after the low-resistance state is attained. Therefore, it is possible to implement a resistance variable nonvolatile memory element and a resistance variable nonvolatile memory device which perform a resistance changing operation stably.

Figure 7:
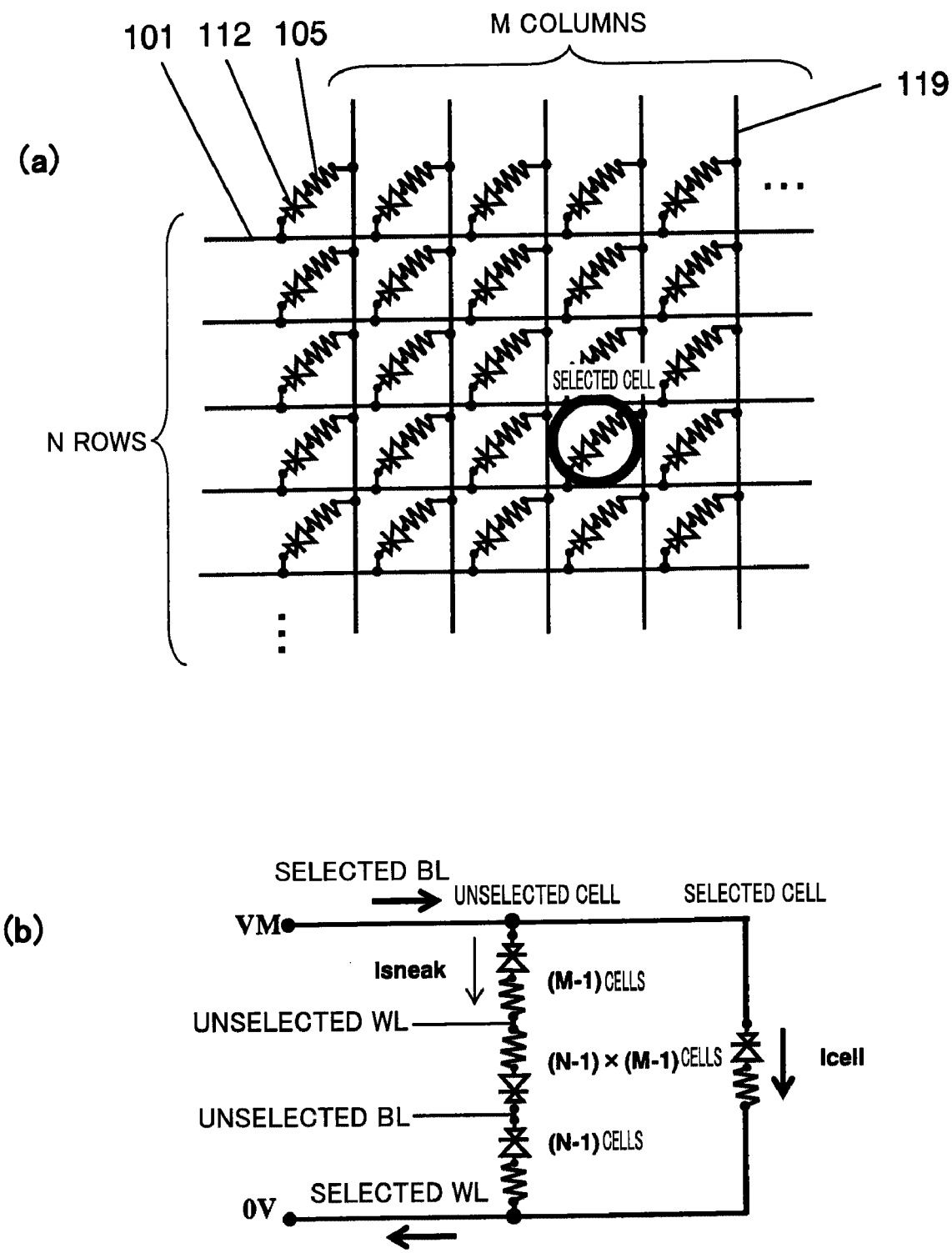

FIG. 7 is a view showing a circuit of the nonvolatile memory device according to Embodiment 1 of the present invention, in which FIG. 7(a) is a circuit diagram of the nonvolatile memory device according to Embodiment 1 of the present invention, and FIG. 7(b) is an equivalent circuit diagram showing a current flowing through a selected cell and unselected cells in a case where the selected cell of FIG. 7(a) is used as a reference.

As shown in FIG. 7(a), a cross-point memory cell array is configured such that the resistance variable elements 105 and the current controlling elements 112 are formed to respectively correspond to the three-dimensional cross-points of N-rows of word lines (first wires 101) and M-columns of bit lines (second wires 119). The current controlling element 112 has an unsymmetric characteristic with respect to the polarity and therefore, the current drivabilities of the diode elements are expressed as the magnitude of symbols $\Delta$ and $\nabla$.

As shown in FIG. 7(b), when 0V is applied to a selected word line (one of the first wires 101), and a VM is applied to a selected bit line (one of the second wires 119), a rewrite current Icell flows through the selected cell. In this case, for unselected cells, there are sneak current paths which connect (M−1) cells on the column to which the selected cell belongs to (N−1) cells on the row to which the selected cell belongs, i.e., sneak current paths which are as many as (N−1)×(M−1) cells which is a product of these, and a sum of currents flowing therethrough is expressed as a sneak current I sneak. By using the unsymmetric current controlling elements, one or more current controlling elements in a direction with a lower current drivability are always included in the sneak current paths, regardless of whether the positive voltage or the negative voltage is applied to the selected cell. This can lessen an overall amount of sneak current.

[Modification]

In a case where the arrangement (vertical positional relationship) of the resistance variable element and the current controlling element is reversed, similar advantage is achieved by connecting the lower electrode of the resistance variable element to the upper electrode of the current controlling element such that the resistance variable layer and the semiconductor layer do not intervene between the lower electrode and the upper electrode.

In the configuration in which the resistance variable element is connected in series with the current controlling element, the upper electrode of one of the resistance variable element and the current controlling element and the lower electrode of the other may be an identical constituent. To be specific, in the configuration in which the resistance variable element is located at the lower side and the current controlling element is located at the upper side, the upper electrode of the resistance variable element and the lower electrode of the current controlling element may be an identical constituent. In the configuration in which the current controlling element is located at the lower side and the resistance variable element is located at the upper side, the upper electrode of the current controlling element and the lower electrode of the resistance variable element may be an identical constituent.

In the above description, the resistance variable element is changed to the high-resistance state, and the current controlling element is allowed to have a higher current drivability when the current flows from the second wire 119 to the first wire 101 (current flows from the upper side to the lower side with respect to the substrate). Alternatively, the resistance variable element may be changed to the high-resistance state, and the current controlling element is allowed to have a higher current drivability when the current flows from the first wire 101 to the second wire 119 (current flows from the lower side to the upper side with respect to the substrate). In this case, for example, in each of the resistance variable element and the current controlling element, the materials of the upper electrode and the lower electrode may be reversed. Further, the arrangement (vertical positional relationship) of the resistance variable element and the current controlling element may be reversed.

Although tungsten is used for the lower electrode of the current controlling element, n-type silicon is used for the semiconductor layer of the current controlling element and tantalum nitride is used for the upper electrode of the current controlling element as described above, other metals and semiconductor layers may be used so long as $\chi s<\Phi 1<\Phi 2$ is satisfied. FIG. 8 is a table showing examples of metals and semiconductor layers which are selectable. By adding nitrogen to the n-type silicon, the current drivability can be reduced ($\Phi B$ can be increased) and a desired current drivability can be designed. By making a difference between the amount of nitrogen added to the upper electrode interface and the amount of nitrogen added to the lower electrode interface, it is possible to achieve an advantage similar to the advantage achieved in a case where different electrodes are used. Therefore, by making a difference in nitrogen added amount between the upper electrode side and the lower electrode side, a current controlling element having an unsymmetric characteristic may be fabricated.

As the semiconductor layer of the current controlling element, desired semiconductor materials such as silicon nitride may be used instead of silicon. In an actual nonvolatile memory device 10, silicon nitride is desirably used in view of an electric resistance and a current supply capability.

[Manufacturing Method]

Figure 9:
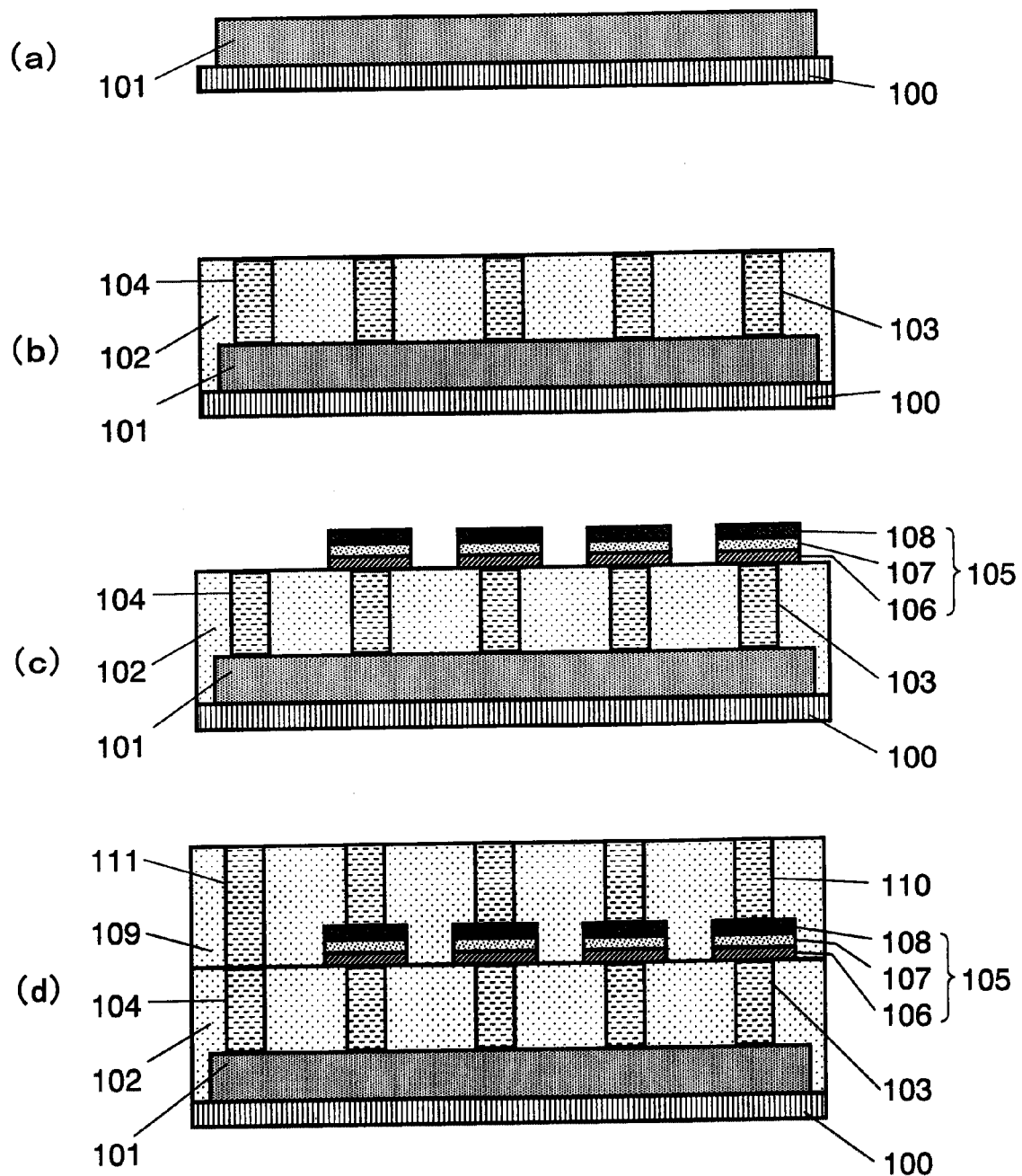
Figure 10:
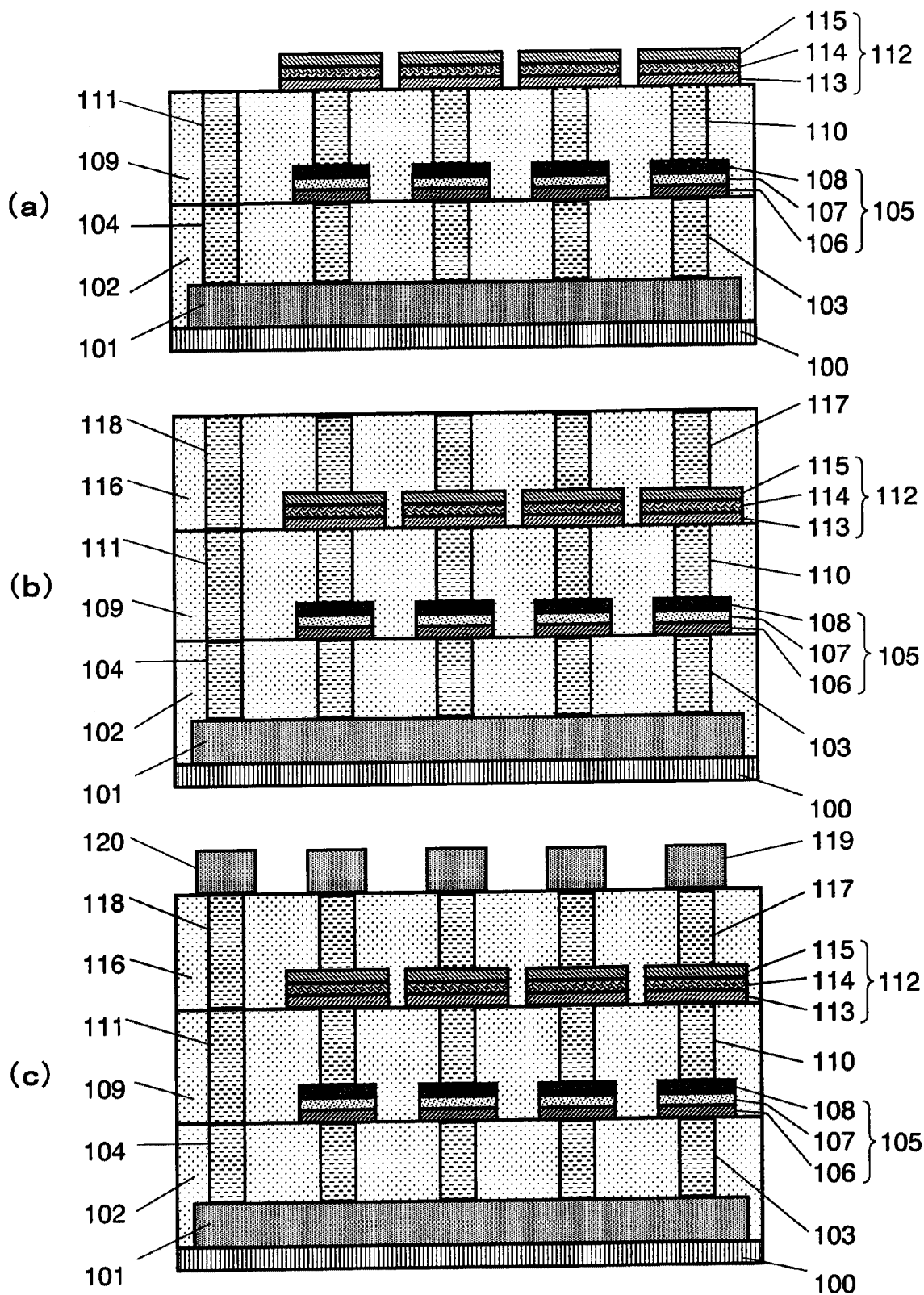
FIG. 10 is process step view showing a manufacturing method of the nonvolatile memory device 10 of this embodiment.

FIGS. 9 and 10 are process step views showing the manufacturing method of the nonvolatile memory device 10 of this embodiment. FIG. 9(a) is a view showing a step of forming first wires on a substrate, FIG. 9(b) is a view showing a step of forming a first interlayer insulating layer, first contact plugs and second contact plugs, FIG. 9(c) is a view showing a step of forming resistance variable elements and FIG. 9(d) is a view showing a step of forming a second interlayer insulating layer, third contact plugs and fourth contact plugs. FIG. 10(a) is a view showing a step of forming current controlling elements, FIG. 10(b) is a step of forming a third interlayer insulating layer, fifth contact plugs and sixth contact plugs, and FIG. 10(c) is a view showing a step of forming second wires and lead-out wires.

As shown in FIG. 9(a), in the step of forming the first wires on the substrate, the first wires 101 are formed on the substrate 100 provided with transistors and lower wires, using a desired mask.

Then, as shown in FIG. 9(b), in the step of forming the first interlayer insulating layer, the first contact plugs and the second contact plugs, the first interlayer insulating layer 102 is formed over the entire surface of the substrate 100 such that the first interlayer insulating layer 102 covers the first wires 101. The contact holes (holes) are formed to penetrate the first interlayer insulating layer 102 and reach the first wires 101. A filling material containing tungsten as a major component is filled into the contact holes, thereby forming the first contact plugs 103 and the second contact plugs 104.

Then, as shown in FIG. 9(c), in the step of forming the resistance variable elements, a conductive layer comprising tantalum nitride, a resistance variable layer comprising tantalum oxide and a conductive layer comprising platinum are formed over the first interlayer insulating layer 102 in this order. Patterning is performed using a desired mask so as to cover the upper end surfaces of the first contact plugs 103 and expose the upper end surfaces of the second contact plugs 104, thereby forming the lower electrodes 106, the resistance variable layers 107 and the upper electrodes 108 of the resistance variable elements 105. The oxygen-deficient tantalum oxide can be deposited by, for example, so-called reactive sputtering in which sputtering is performed under an atmosphere of argon and oxygen gases, using a tantalum target.

Then, as shown in FIG. 9(d), in the step of forming the second interlayer insulating layer, the third contact plugs, and the fourth contact plugs, the second interlayer insulating layer 109 is formed over the entire surface of the first interlayer insulating layer 102 so as to cover the resistance variable elements 105. Contact holes (holes) are formed to penetrate the second interlayer insulating layer 109 and reach the upper electrodes 108 of the resistance variable elements 105, while contact holes (holes) are formed to penetrate the second interlayer insulating layer 109 and reach the second contact plugs 104. A filling material containing tungsten as a major component is filled into the former contact holes to form the third contact plugs 110. A filling material containing tungsten as a major component is filled into the latter contact holes to form the fourth contact plugs 111.

Then, as shown in FIG. 10(a), in the step of forming the current controlling elements, the conductive layer comprising tungsten, the semiconductor layer comprising silicon or silicon nitride, and the conductive layer comprising tantalum nitride are formed in this order over the second interlayer insulating layer 109. Patterning is performed using a desired mask to cover the upper end surfaces of the third contact plugs 110 and expose the upper end surfaces of the fourth contact plugs 111, thereby forming the lower electrodes 113, the semiconductor layers 114 and the upper electrodes 115 of the current controlling elements 112.

Then, as shown in FIG. 10(b), in the step of forming the third interlayer insulating layer, the fifth contact plugs and the sixth contact plugs, the third interlayer insulating layer 116 is formed over the entire surface of the second interlayer insulating layer so as to cover the current controlling elements 112. Contact holes (holes) are formed to penetrate the third interlayer insulating layer 116 and reach the upper electrodes 115 of the current controlling elements 112, and contact holes (holes) are formed to penetrate the third interlayer insulating layer 116 and reach the fourth contact plugs 111. A filling material containing tungsten as a major component is filled into the former contact holes to form the fifth contact plugs 117. A filling material containing tungsten as a major component is filled into the latter contact holes to form the sixth contact plugs 118.

As shown in FIG. 10(c), in the step of forming the second wires and the lead-out wires, the second wires 119 and the lead-out wires 120 are patterned using a desired mask on the third interlayer insulating layer 116 such that the second wires 119 cover the upper end surfaces of the fifth contact plugs 117, respectively, and the lead-out wires 120 cover the upper end surfaces of the sixth contact plugs 118, respectively.

By the above described manufacturing method, a resistance variable nonvolatile memory device which performs a resistance changing operation stably is attainable.

Embodiment 2

Figure 11:
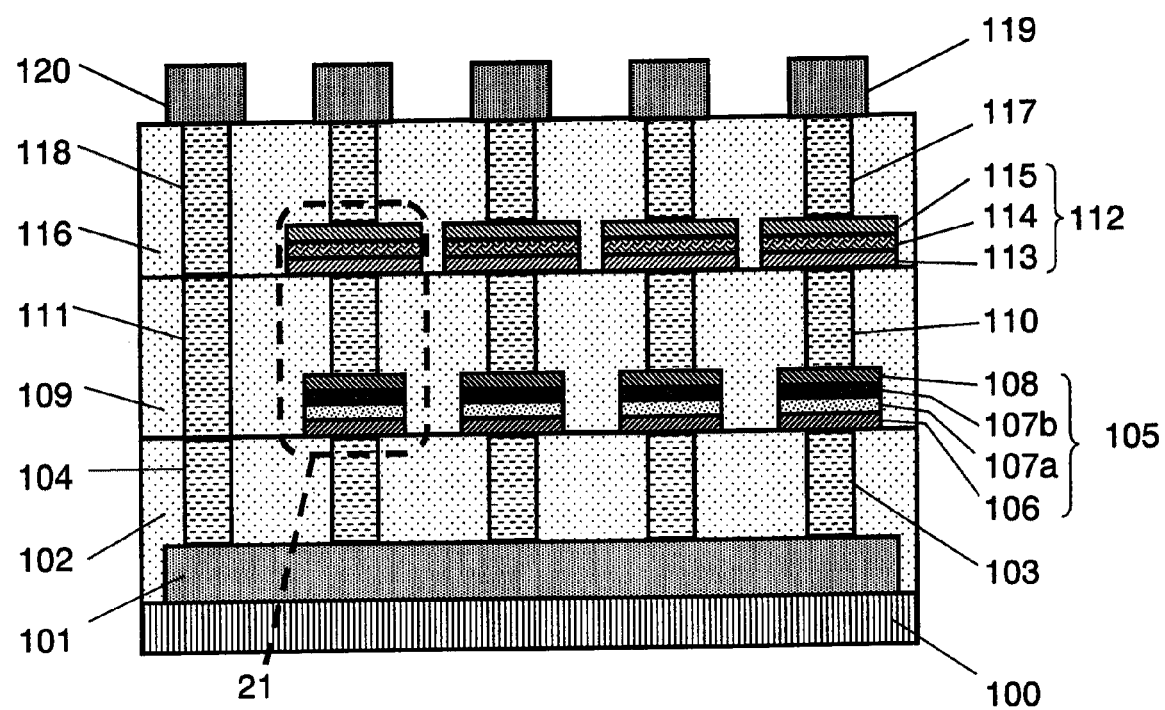
FIG. 11 is a cross-sectional view showing an exemplary schematic configuration of a nonvolatile memory element and a nonvolatile memory device according to Embodiment 2 of the present invention.

FIG. 11 is a cross-sectional view showing an exemplary schematic configuration of a nonvolatile memory element and a nonvolatile memory device according to Embodiment 2 of the present invention. A nonvolatile memory device 20 and a nonvolatile memory element 21 of Embodiment 2 are different from the nonvolatile memory device 10 and the nonvolatile memory element 11 of Embodiment 1 in that a resistance variable layer of a resistance variable element has a stacked structure. The other constituents are similar to those of Embodiment 1. Therefore, in Embodiment 2, the same constituents as those in Embodiment 1 are designated by the same reference numerals and will not be described repetitively.

As shown in FIG. 11, in the nonvolatile memory device 20 and the nonvolatile memory element 21, each resistance variable layer is composed of two layers which are a resistance variable layer 107a (first layer) and a resistance variable layer 107b (second layer). The resistance variable layer 107a and the resistance variable layer 107b comprise the same element, i.e., oxygen-deficient oxide of the same transition metal. However, the oxygen content (the value of x in a case where transition metal is expressed as M and the composition of the resistance variable layer 107a is expressed as $MO_x$) of the resistance variable layer 107a which is in contact with the lower electrode 106 is lower than the oxygen content (value of y in a case where transition metal is expressed as M and the composition of the resistance variable layer 107b is expressed as $MO_y$) of the resistance variable layer 107b which is in contact with the upper electrode 108 (x<y).

In a mechanism of the resistance changing operation, redox reactions of the transition metal in the vicinity of the electrode interface are dominant. Therefore, a resistance changing phenomenon occurs preferentially at the upper electrode side (interface between the upper electrode 108 and the resistance variable layer 107b) where oxygen which contributes to redox reactions is more in amount.

The thickness of the resistance variable layer 107a and the thickness of the resistance variable layer 107b are set to, for example, 30~50 nm. The shape of the resistance variable layer 107a and the resistance variable layer 107b may be, for example, a square of 0.5 μm×0.5 μm, when viewed in the thickness direction.

Since the resistance changing operation always occurs only at a specified interface in the configuration of this embodiment, it is possible to attain a resistance variable nonvolatile memory device and a resistance variable nonvolatile memory element which perform a resistance changing operation more stably. The resistance variable layers with different oxygen contents can be formed with the manufacturing method (reactive sputtering process) of the resistance variable layer described in Embodiment 1. That is, the oxygen content of the stacked tantalum oxide is higher as the oxygen flow rate is set higher during the deposition, while the oxygen content of the stacked tantalum oxide is lower as the oxygen flow rate is set lower during the deposition.

Embodiment 3

Figure 12:
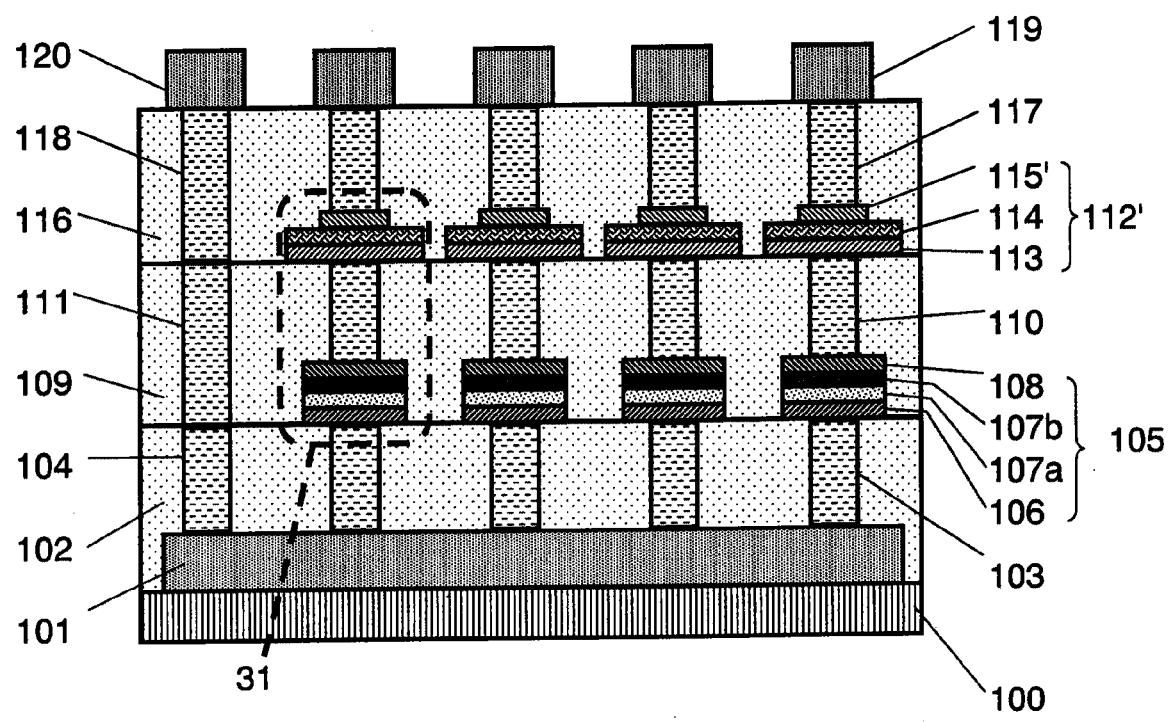
FIG. 12 is a cross-sectional view showing an exemplary schematic configuration of a nonvolatile memory element and a nonvolatile memory device according to Embodiment 3 of the present invention.

FIG. 12 is a cross-sectional view showing an exemplary schematic configuration of a nonvolatile memory element and a nonvolatile memory device according to Embodiment 3 of the present invention. A nonvolatile memory device 30 and a nonvolatile memory element 31 of Embodiment 3 are different from the nonvolatile memory device 20 and the nonvolatile memory element 21 of Embodiment 2 in that the lower electrode and the upper electrode of the current controlling element are different in size (contact area). The other constituents are similar to those of Embodiment 2. Therefore, in Embodiment 3, the same constituents as those in Embodiment 2 are designated by the same reference numerals and will not be described repetitively.

As shown in FIG. 12, in the nonvolatile memory device 30 and the nonvolatile memory element 31, when a contact area of the lower electrode 113 and the semiconductor layer 114 is S1 and a contact area of an upper electrode 115' and the semiconductor layer 114 is S2, S1>S2 is satisfied (Although only a cross section parallel to the first wires 101 is shown in FIG. 12, the width of the upper electrode 115' is set smaller than the width of the semiconductor layer 114, in the cross section parallel to the second wire 119).

As described above, the current drivability of the MSM diode is determined by the magnitude of the current in the reverse bias direction. In this embodiment, a current flowing when a voltage in the reverse bias direction (direction in which the semiconductor layer 114 is at a higher potential than the lower electrode 113) is applied to the lower electrode interface (contact area=S1) with a larger area is higher than a current flowing when a voltage in the reverse bias direction (direction in which the semiconductor layer 114 is at a higher potential than an upper electrode 115') is applied to the upper electrode interface (contact area=S2) with a smaller area. Therefore, a current controlling element 112' has a higher current drivability when the current flows from the upper electrode to the lower electrode.

By connecting the upper electrode 108 of the resistance variable element 105 to the lower electrode 113 of the current controlling element 112', a high current required to attain the high-resistance state is obtained when a positive voltage is applied to the second wire 119 on the basis of the first wire 101 (when the resistance variable element 105 is changed to the high-resistance state). When a negative voltage is applied to the second wire 119 on the basis of the first wire 101 (when the resistance variable element 105 is changed to the low-resistance state), a minimum current required to attain the low-resistance state flows, and the current controlling element 112' can prevent a high current from flowing abruptly after the low-resistance state is attained. Therefore, it is possible to implement a resistance variable nonvolatile memory element and a resistance variable nonvolatile memory device which perform a resistance changing operation stably.

[Manufacturing Method]

Figure 13:
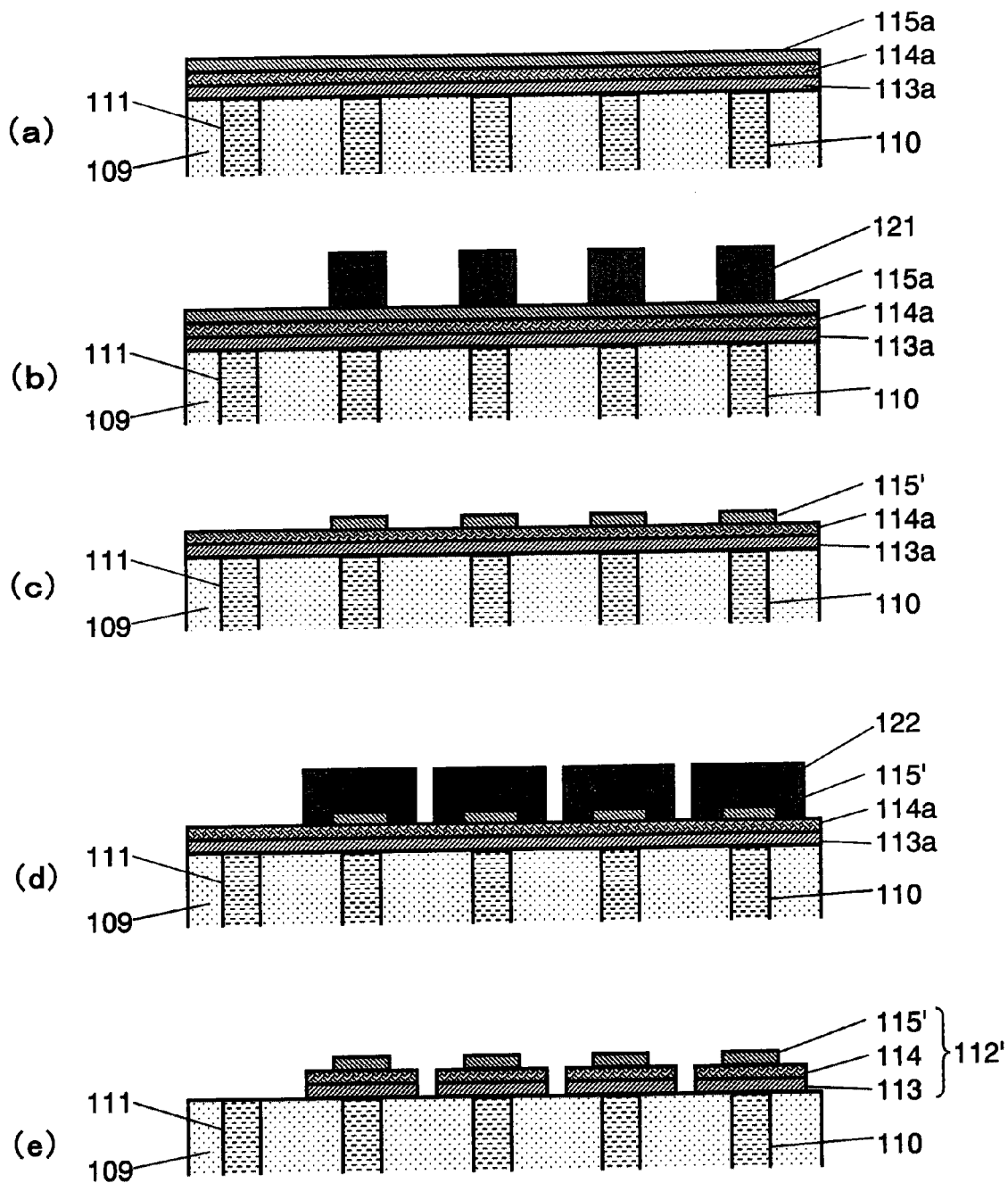

FIG. 13 is a process step view showing the manufacturing method of major constituents of the nonvolatile memory device 30 of this embodiment. The manufacturing method of other constituents is similar to that of Embodiment 1 and will not be described repetitively.

FIG. 13(a) is a view showing a step of forming the conductive layer, the semiconductor layer and the conductive layer over the second interlayer insulating layer in this order, FIG. 13(b) is a view showing a step of forming a resist pattern over the conductive layer, FIG. 13(c) is a view showing a step of forming the upper electrodes of current controlling elements, and FIG. 13(d) is a view showing a step of forming a resist pattern on the semiconductor layer using a desired mask, and FIG. 13(e) is a view showing a step of forming the semiconductor layers and the lower electrodes of the current controlling elements.

As shown in FIG. 13(a), in the step of forming the conductive layer, the semiconductor layer and the conductive layer in this order over the second interlayer insulating layer, a conductive layer 113a comprising tungsten, a semiconductor layer 114a comprising silicon or silicon nitride, and a conductive layer 115a comprising tantalum nitride are formed in this order over the entire surface of the second interlayer insulating layer 109 provided with the third contact plugs 110 and the fourth contact plugs 111.

Then, as shown in FIG. 13(b), in the step of forming the photoresist pattern on the conductive layer, a photoresist pattern 121 is formed on the conductive layer 115a comprising tantalum nitride using a desired mask.

Then, as shown in FIG. 13(c), in the step of forming the upper electrodes of the current controlling elements, the conductive layer 115a comprising tantalum nitride is patterned using the photoresist pattern 121, to form the upper electrodes 115' of the current controlling elements. Then the photoresist left is removed.

Then, as shown in FIG. 13(d), in the step of forming the photoresist pattern on the semiconductor layer using a desired mask, a photoresist pattern 122 is formed using a desired mask on the semiconductor layer 114a comprising silicon to cover the upper electrodes 115' of the current controlling elements 112'.

Then, as shown in FIG. 13(e), in the step of forming the semiconductor layers and the lower electrodes of the current controlling elements, the semiconductor layer 114a comprising silicon or silicon nitride and the conductive layer 113a comprising tungsten are patterned using the photoresist pattern 122 to cover the upper end surfaces of the third contact plugs 110 and expose the upper end surfaces of the fourth contact plugs 111, thereby forming the semiconductor layers 114 and the lower electrodes 113 of the current controlling elements 112'.

With the above manufacturing method, it is possible to implement a nonvolatile memory device and a nonvolatile memory element which include the current controlling elements in which the contact area of the upper electrode and the semiconductor layer is different from the contact area of the lower electrode and the semiconductor layer.

Embodiment 4

[Configuration]

Figure 14:
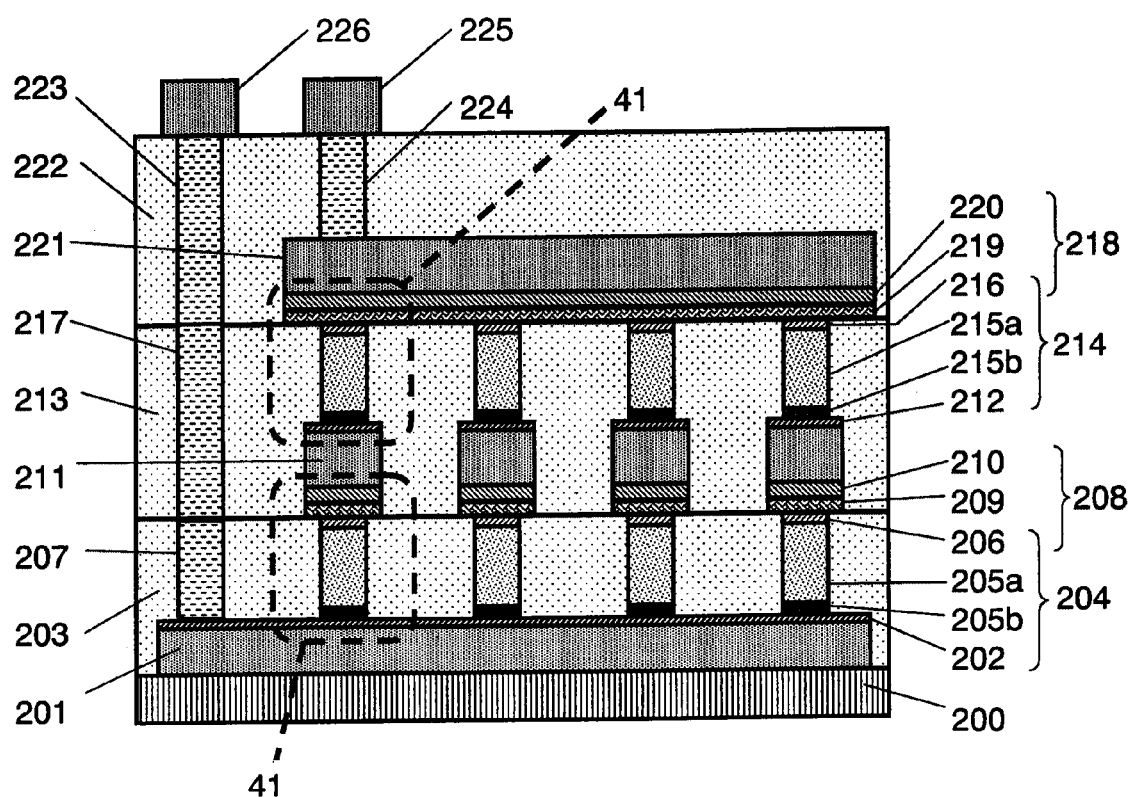
FIG. 14 is a cross-sectional view showing an exemplary schematic configuration of a nonvolatile memory element and a nonvolatile memory device according to Embodiment 4 of the present invention.
Figure 15:
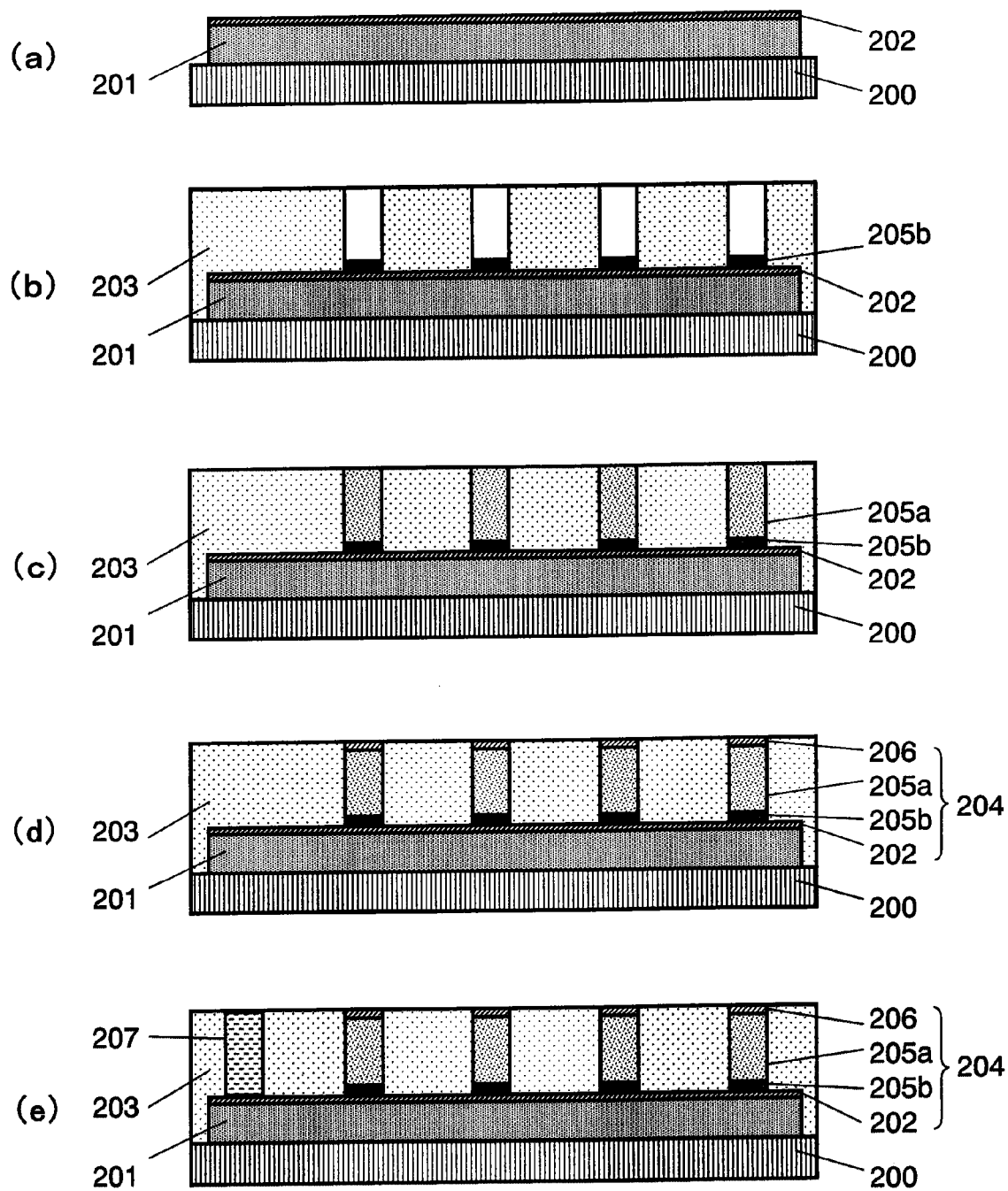

FIG. 14 is a cross-sectional view showing an exemplary schematic configuration of a nonvolatile memory element and a nonvolatile memory device according to Embodiment 4 of the present invention. A nonvolatile memory device 40 and a nonvolatile memory element 41 of Embodiment 4 are different from those in Embodiment 1~Embodiment 3 in that the lower electrode of the resistance variable element is formed integrally with the wire, remaining constituents of the resistance variable element are formed inside the through-hole, the lower electrode of the current controlling element is formed inside the through-hole, remaining constituents of the current controlling element are formed integrally with the wire, and the memory cells are stacked in two layers. Embodiment 4 is adapted for achievement of miniaturization and a large capacity.

As shown in FIG. 14, the nonvolatile memory device 40 of this embodiment includes in a schematic configuration, a substrate 200, a plurality of first wires 201 which are formed to extend in parallel with each other in a first direction (rightward and leftward direction in FIG. 14) on a main surface of the substrate 200, a plurality of second wires 211 which are formed above the plurality of first wires 201 such that the plurality of second wires 211 extend in parallel with each other in a second direction (direction perpendicular to the depth direction of sheet of FIG. 14) within a plane parallel to the main surface of the substrate 200 and three-dimensionally cross the plurality of first wires 201, respectively, a plurality of third wires 221 formed above the plurality of second wires 211 such that the plurality of third wires 221 extend in parallel with each other in a third direction (rightward and leftward direction in FIG. 14) within a plane parallel to the main surface of the substrate 200 and three-dimensionally cross the plurality of second wires 211, respectively, first nonvolatile memory elements 41 which are provided to respectively correspond to three-dimensional cross-points of the first wires 201 and the second wires 211 such that the nonvolatile memory elements 41 connect the first wires 201 to the second wires 211, respectively, and second nonvolatile memory elements 42 which are provided to respectively correspond to three-dimensional cross-points of the second wires 211 and the third wires 221 such that the second nonvolatile elements 42 connect the second wires 211 to the third wires 221, respectively. In this embodiment, the first wires 201 and the third wires 221 have the same shape and overlap with each other when viewed in the stacking direction (from above in FIG. 14, hereinafter referred to as a thickness direction) of the first wires 201.

Each first nonvolatile memory element 41 includes a first resistance variable element 204 and a first current controlling element 208. As describe later, the upper electrode of the first resistance variable element 204 and the lower electrode of the first current controlling element 208 are an identical constituent.

Each first resistance variable element 204 includes a first conductive layer 202 constituting a lower electrode (second electrode), a first intermediate electrode 206 constituting an upper electrode (first electrode), and a resistance variable layer sandwiched between these two electrodes. The resistance variable layer is composed of two layers which are a first resistance variable layer 205b (second layer) and a second resistance variable layer 205a (first layer). The first resistance variable layer 205b which is in contact with the first conductive layer 202 comprises oxygen-deficient tantalum oxide with high oxygen content. The second resistance variable layer 205a which is in contact with the first intermediate electrode 206 comprises oxygen-deficient tantalum oxide with low oxygen content. Alternatively, instead of tantalum oxide, hafnium oxide may be used, or other oxygen-deficient transition metal oxide may be used. The definition of the oxygen content of the first resistance variable layer 205b and the oxygen content of the second resistance variable layer 205a is the same as that in Embodiment 2, and will not be described repetitively.

The thickness of the first resistance variable layer 205a and the thickness of the second resistance variable layer 205b may be set to, for example, 100~200 nm and 1~10 nm, respectively. The diameter of the first resistance variable layer 205a and the diameter of the second resistance variable layer 205b in a thickness direction may be set to, for example, 50~300 nm Φ.

Each first current controlling element 208 includes a first intermediate electrode 206 constituting a lower electrode (first electrode), a second conductive layer 210 constituting an upper electrode (third electrode) and a first semiconductor layer 209 sandwiched between these two electrodes. The first intermediate electrode 206 serves as the upper electrode of the first resistance variable element 204 and the lower electrode of the first current controlling element 208.

Each second nonvolatile memory element 42 includes a second resistance variable element 214 and a second current controlling element 218. As described later, the upper electrode of the second resistance variable element 224 and the lower electrode of the second current controlling element 228 are an identical constituent.

Each second resistance variable element 214 includes a third conductive layer 212 constituting a lower electrode (second electrode), a second intermediate electrode 216 constituting an upper electrode (first electrode) and a resistance variable layer sandwiched between these two electrodes. The resistance variable layer has two layers which are a third resistance variable layer 215b (second layer) and a fourth resistance variable layer 215a (first layer). The third resistance variable layer 215b which is in contact with the third conductive layer 212 comprises oxygen-deficient tantalum oxide with high oxygen content. The fourth resistance variable layer 215a which is in contact with the second intermediate electrode 216 comprises oxygen-deficient tantalum oxide with low oxygen content. Alternatively, instead of tantalum oxide, hafnium oxide may be used, or other oxygen-deficient transition metal oxide may be used. The definition of the oxygen content of the third resistance variable layer 215b and the oxygen content of the fourth resistance variable layer 215a is the same as that in Embodiment 2, and will not be described repetitively.

The thickness of the third resistance variable layer 215a and the thickness of the fourth resistance variable layer 215b are set to, for example, 100~200 nm and 1~10 nm, respectively.

Each second current controlling element 218 includes a second intermediate electrode 216 constituting a lower electrode (first electrode), a fourth conductive layer 220 constituting an upper electrode (third electrode), and a second semiconductor layer 219 sandwiched between these two electrodes. The second intermediate electrode 216 serves as the upper electrode of the second resistance variable element 214 and the lower electrode of the second current controlling element 218.

On the substrate 200, the first wire 201 and the first conductive layer 202 are stacked together in this order to have the same shape and overlap with each other when viewed in the thickness direction. A first interlayer insulating layer 203 is formed to cover the first wires 201 and the first conductive layers 202. A plurality of though-holes are formed on the first conductive layers 202 to penetrate the first interlayer insulating layer 203 and reach the first conductive layers 202 such that the through holes are arranged at equal intervals when viewed in the thickness direction. On the first conductive layer 202 exposed in each through-hole, the first resistance variable layer 205b, the second resistance variable layer 205a, and the first intermediate electrode 206 are stacked together in this order.

On the first interlayer insulating layer 203, the first semiconductor layer 209, the second conductive layer 210, the second wire 211 and the third conductive layer 212 are stacked together in this order to have the same shape and overlap with each other when viewed in the thickness direction so as to cover the upper end surface of each of the first intermediate electrodes 206. A second interlayer insulating layer 213 is formed to cover the first semiconductor layers 209, the second conductive layers 210, the second wires 211 and the third conductive layers 212. A plurality of though-holes are formed on the third conductive layers 212 to penetrate the second interlayer insulating layer 213 and reach the third conductive layers 212 such that the through-holes are arranged at equal intervals when viewed in the thickness direction. On the third conductive layer 212 exposed in each through-hole, the third resistance variable layer 215b, the fourth resistance variable layer 215a, and the second intermediate electrode 216 are stacked together in this order.

On the second interlayer insulating layer 213, the second semiconductor layer 219, the fourth conductive layer 220 and the third wire 221 are stacked together in this order to have the same shape and overlap with each other when viewed in the thickness direction so as to cover the upper end surface of each of the second intermediate electrodes 216. A third interlayer insulating layer 222 is formed to cover the second semiconductor layers 219, the fourth conductive layers 220 and the third wires 221. Contact holes are formed at end portions of the third wires to penetrate the third interlayer insulating layer 222 and reach the third wires. Fourth contact plugs 224 are formed on the third wires exposed in the respective contact holes, and first lead-out wires 225 are formed to cover the upper end surfaces of the fourth contact plugs 224 and to extend in a fourth direction such that the first lead-out wires 225 three-dimensionally cross the third wires, respectively.

Outside a region where the first nonvolatile memory elements 41 and the second nonvolatile memory elements 42 are arranged when viewed in the thickness direction, on the third interlayer insulating layer 222, second lead-out wires 226 are formed to extend in parallel with the first lead-out wires 225, i.e., in the fourth direction. First contact plugs 207, second contact plugs 217 and third contact plugs 223 penetrate the first interlayer insulating layer 203, the second interlayer insulating layer 213 and the third interlayer insulating layer 222, respectively such that the first wires 201 are connected to the lead-out wires 226, respectively. In other words, the first contact plug 107, the second contact plug 217 and the third contact plug 223 are stacked together in this order and interconnected to form a stacked contact for connecting the first wire 201 to the lead-out wire 226.

In such a configuration, it is possible to implement a nonvolatile memory device including a two-layer cross-point memory cell array, in which the first nonvolatile memory elements 41 are provided at three-dimensional cross-points of the first wires 201 and the second wires 211 which three-dimensionally cross each other, and the second nonvolatile memory elements 42 are provided at three-dimensional cross-points of the second wires 211 and the third wires 221 which three-dimensionally cross each other, when the nonvolatile memory device 40 is viewed in the thickness direction.

The first conductive layer 202 and the third conductive layer 212 serve as the lower electrodes of the resistance variable elements, respectively, and comprise, for example, platinum. The first intermediate electrode 206 and the second intermediate electrode 216 serve as the upper electrode of the resistance variable element and the lower electrode of the current controlling element, respectively, and comprise, for example, tantalum nitride. The second conductive layer 210 and the fourth conductive layer 220 serve as the upper electrodes of the current controlling elements, respectively, and comprise, for example, tungsten. The first semiconductor layer 209 and the second semiconductor layer 219 comprise, for example, silicon or silicon nitride.

The first wires 201, the second wires 211, the third wires 221, the first lead-out wires 225 and the second lead-out wires 226 comprise, for example, copper. The first contact plugs 207, the second contact plugs 217, the third contact plugs 223 and the fourth contact plugs 224 comprise, for example, tungsten. The first interlayer insulating layer 203, the second interlayer insulating layer 213 and the third interlayer insulating layer 222 comprise, for example, silicon oxide.

In the first resistance variable element 204 and the second resistance variable element 214, the standard electrode potential (platinum: $1.18V=V2$) of the material (second material) of the lower electrodes (first conductive layer 202 and third conductive layer 212) is higher than the standard electrode potential (tantalum nitride: $0.48V=V1$) of the material (first material) of the upper electrodes (first intermediate electrode 206 and second intermediate electrode 216). When the resistance variable layer comprises tantalum oxide, $Vt=-0.6V$ (standard electrode potential of tantalum). When the resistance variable layer comprises hafnium oxide, $Vt=-1.55V$ (standard electrode potential of hafnium). In either case, $Vt<V2$ and $V1<V2$ are satisfied.

The oxygen content of the first resistance variable layer 205b which is in contact with the lower electrode is higher than the oxygen content of the second resistance variable layer 205a which is in contact with the upper electrode. The oxygen content of the third resistance variable layer 215b which is in contact with the lower electrode is higher than the oxygen content of the fourth resistance variable layer 215a which is in contact with the upper electrode. For the reasons described in Embodiment 1 and Embodiment 2, the resistance changing phenomenon occurs preferentially at the interface between the lower electrode and the resistance variable layer. When the resistance variable element is changed to the high-resistance state, a positive voltage is applied to the lower electrode on the basis of the upper electrode, and a current flows from the lower electrode to the upper electrode. When the resistance variable element is changed to the low-resistance state, a negative voltage is applied to the lower electrode on the basis of the upper electrode, and a current flows from the upper electrode to the lower electrode (the vertical positional relationship is reversed between Embodiment 1 and Embodiment 3).

In the first current controlling element 208 and the second current controlling element 218, the work function (tungsten: $\Phi1=4.6$ eV) of the upper electrodes (second conducive layer 210 and fourth conductive layer 220) is smaller than the work function (tantalum nitride: $\Phi2=4.78$ eV) of the lower electrodes (first intermediate electrode 206 and second intermediate electrode 216). The area of a portion of the upper electrode and a portion of the semiconductor layer which are in contact with each other is smaller than the area of a portion of the lower electrode and a portion of the semiconductor layer which are in contact with each other. Therefore, a current flowing in the case where the upper electrode side is reversely biased is higher than a current flowing in the case where the lower electrode side is reversely biased. In other words, the current drivability of the first current controlling element 208 and the current drivability of the second current controlling element 218 are higher when the current flows from the lower electrode to the upper electrode (the vertical positional relationship is reversed between Embodiment 1 and Embodiment 3).

[Feature of Nonvolatile Memory Device and Nonvolatile Memory Element of This Embodiment]

The nonvolatile memory device 40 and the nonvolatile memory elements 41 and 42 of this embodiment are configured such that the resistance variable element is connected in series with the current controlling element, and a voltage applied to the current controlling element when the resistance variable element is changed from the low-resistance state to the high-resistance state (attains the high-resistance state) is set to have a polarity with which a higher current is allowed to flow through the current controlling element if the absolute values of the voltages applied to the current controlling element are equal. To be specific, a current flows from the lower electrode to the upper electrode in the resistance variable element in this embodiment when the resistance variable element is changed to the high-resistance state. The fact that the current flows in such a direction means that a voltage having a polarity with which the upper electrode is placed at a negative potential on the basis of the lower electrode is applied to the associated current controlling element. The polarity with which the upper electrode is placed at a negative potential on the basis of the lower electrode is the polarity with which the current drivability of the current controlling element is higher.

In other words, the upper electrode of the resistance variable element and the lower electrode of the current controlling element are formed by an identical constituent so that the direction of the voltage for changing the resistance variable layer of the resistance variable element from the low-resistance state to the high-resistance state is the same as the direction for allowing the current controlling element to have a higher current drivability and the direction of the voltage for changing the resistance variable layer of the resistance variable element from the high-resistance state to the low-resistance state is the same as the direction for allowing the current controlling element to have a lower current drivability.

In such a configuration, a high current required to attain the high-resistance state is obtained when a negative voltage is applied to the second wire 211 on the basis of the first wire 201 (when the resistance variable element 204 is changed to the high-resistance state). When a positive voltage is applied to the second wire 211 on the basis of the first wire 201 (when the resistance variable element 204 is changed to the low-resistance state), a minimum current required to attain the low-resistance state flows, and the current controlling element 208 can prevent a high current from flowing abruptly after the low-resistance state is attained.

A high current required to attain the high-resistance state is obtained when a negative voltage is applied to the third wire 211 on the basis of the second wire 211 (when the resistance variable element 214 is changed to the high-resistance state). When a positive voltage is applied to the third wire 221 on the basis of the second wire 211 (when the resistance variable element 214 is changed to the low-resistance state), a minimum current required to attain the low-resistance state flows, and the current controlling element 218 can prevent a high current from flowing abruptly after the low-resistance state is attained.

Therefore, it is possible to implement a resistance variable nonvolatile memory element and a resistance variable nonvolatile memory device which perform a resistance changing operation stably.

Furthermore, in the nonvolatile memory device 40 and the nonvolatile memory elements 41 and 42 of this embodiment, the upper electrode of the resistance variable element and the lower electrode of the current controlling element are formed by an identical constituent, and the lower electrode of the resistance variable element and the semiconductor layer and the upper electrode of the current controlling element have the same shape as the wire and overlap with the wire when viewed in the thickness direction. Therefore, the nonvolatile memory device 40 and the nonvolatile memory elements 41 and 42 of this embodiment are adapted for miniaturization and achievement of a larger capacity.

[Modification]

In this embodiment, also, modification described in Embodiment 1 can be made.

If the arrangement (vertical positional relationship) of the resistance variable element and the current controlling element is reversed, the lower electrode of the resistance variable element and the upper electrode of the current controlling element are an identical constituent (second electrode).

The vertical positional relationship of all of the constituents may be reversed. To be specific, the nonvolatile memory device 40 and the nonvolatile memory elements 41 and 42 may be configured such that the resistance variable element 204 is changed to the high-resistance state when a positive voltage is applied to the second wire 211 on the basis of the first wire 201, and the resistance variable element 214 is changed to the high-resistance state when a positive voltage is applied to the third wire 221 on the basis of the second wire 211.

Alternatively, the direction in which a current for attaining the high-resistance state flows from the upper side to the lower side or from the lower side to the upper side may be different between the resistance variable element 204 and the resistance variable element 214.

[Manufacturing Method]

FIGS. 15 to 18 are process step views showing the manufacturing method of the nonvolatile memory device 40 of this embodiment.

FIG. 15(a) is a view showing a step of forming the first wires and the first conductive layer on the substrate, FIG. 15(b) is a view showing a step of forming the first interlayer insulating layer, the through-holes and the first resistance variable layers, FIG. 15(c) is a view showing a step of filling a material of the second resistance variable layers, FIG. 15(d) is a view showing a step of forming the first intermediate electrodes and FIG. 15(e) is a view showing a step of forming the first contact plugs.

FIG. 16(a) is a view showing a step of forming the first semiconductor layer, the second conductive layer, the second wires and the third conductive layer, FIG. 16(b) is a view showing a step of forming the second interlayer insulating layer, the through-holes and the third resistance variable layers, and FIG. 16(c) is a view showing a step of filling a material of the fourth resistance variable layers.

FIG. 17(a) is a view showing a step of forming the second intermediate electrodes, FIG. 17(b) is a view showing a step of forming the second contact plugs and FIG. 17(c) is a view showing a step of forming the second semiconductor layer, the fourth conductive layer and the third wires.

FIG. 18(a) is a view showing a step of forming the third interlayer insulating layer, the third contact plugs 223 and the fourth contact plugs, and FIG. 18(b) is a view showing a step of forming the first lead-out wires 225 and the second lead-out wires 226.

As shown in FIG. 15(a), in the sep of forming the first wires and the first conductive layer on the substrate, the material (copper) of the first wires 201 and the material (platinum) of the first conductive layer 202 are stacked together in this order over the substrate 200 provided with transistors and lower wires, and are patterned using a desired mask, thereby forming the first wires 201 and the first conductive layers 202.

Then, as shown in FIG. 15(b), in the step of forming the first interlayer insulating layer, the through-holes, and the first resistance variable layers, the first interlayer insulating layer 203 is formed over the entire surface of the substrate 200 to cover the first wires 201 and the first conductive layers 202. The through-holes (holes) are formed to penetrate the first interlayer insulating layer 203 and reach the first conductive layers 202. Oxygen-deficient tantalum oxide with high oxygen content is deposited on the first conductive layers 202 exposed at the bottom of the through-holes, respectively, by sputtering, to form the first resistance variable layers 205b (An unnecessary portion of resistance variable layer deposited on the first interlayer insulating layer 203 is removed by CMP).

Then, as shown in FIG. 15(c), in the step of filling the material of the second resistance variable layers, oxygen-deficient tantalum oxide with low oxygen content is filled into each through-hole by sputtering (An unnecessary portion of resistance variable layer deposited on the first interlayer insulating layer 203 is also removed by CMP).

Then, as shown in FIG. 15(d), in the step of forming the first intermediate electrodes, a portion of oxygen-deficient tantalum oxide with low oxygen content is removed by etching, completing the second resistance variable layers 205a. The first intermediate electrodes 206 comprising tantalum nitride are filled into the recesses formed on the second resistance variable layers 205a, respectively, by sputtering (an unnecessary portion of tantalum nitride deposited on the first interlayer insulating layer 203 is removed by CMP).

Then, as shown in FIG. 15(e), in the step of forming the first contact plugs, the contact holes are formed to penetrate the first interlayer insulating layer 203 and reach the first conductive layers 202. The contact holes are filled with tungsten, to form the first contact plugs 207.

Then, as shown in FIG. 16(a), in the step of forming the first semiconductor layer, the second conductive layer, the second wires and the third conductive layer, the material (silicon or silicon nitride) of the first semiconductor layer 209, the material (tungsten) of the second conductive layer 210, the material (copper) of the second wires 211, and the material (platinum) of the third conductive layer 212 are formed in this order over the first interlayer insulating layer 203. Thereafter, patterning is performed using a desired mask in such a manner that the upper end surfaces of the first intermediate electrodes 206 are covered and the upper end surfaces of the first contact plugs 207 are exposed. The patterning is performed so that the second wires 211 cross the first wires 201 perpendicularly to the first wires 201 when viewed in the thickness direction. Thus, the first semiconductor layers 209, the second conductive layers 210, the second wires 211 and the third conductive layers 212 are completed.

Then, as shown in FIG. 16(b), in the step of forming the second interlayer insulating layer, the through-holes and the third resistance variable layers, the second interlayer insulating layer 213 is formed over the entire surface of the first interlayer insulating layer 203 to cover the first semiconductor layers 209, the second conductive layers 210, the second wires 211 and the third conductive layers 212. The through-holes (holes) are formed to penetrate the second interlayer insulating layer 213 and reach the third conductive layers 212. Oxygen-deficient tantalum oxide with high oxygen content is deposited on the third conductive layers 212 exposed at the bottom of the through-holes, respectively, by sputtering, to form the third resistance variable layers 215b (an unnecessary portion of resistance variable layer deposited on the second interlayer insulating layer 213 are removed by CMP).

Figure 16:
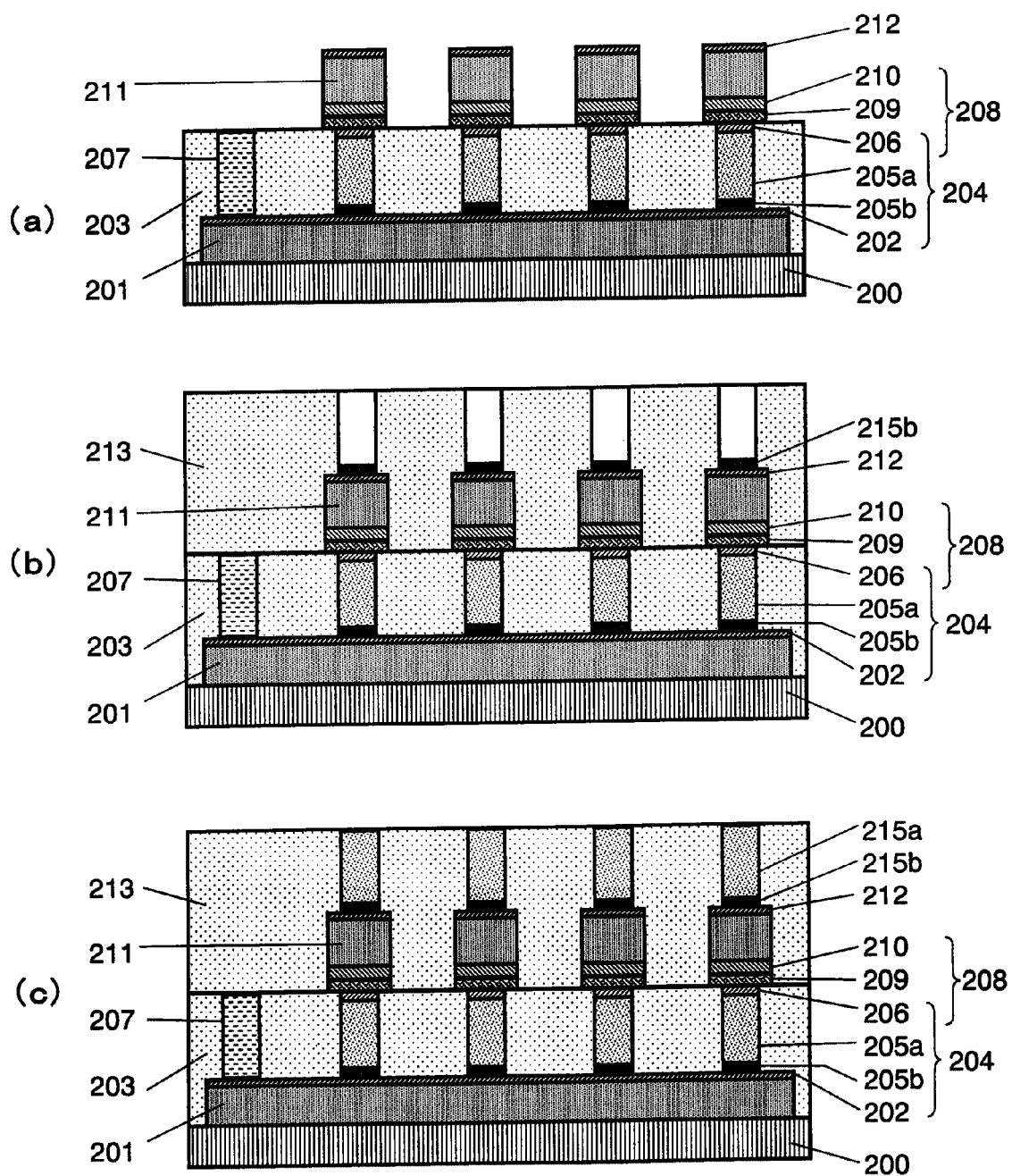
Figure 17:
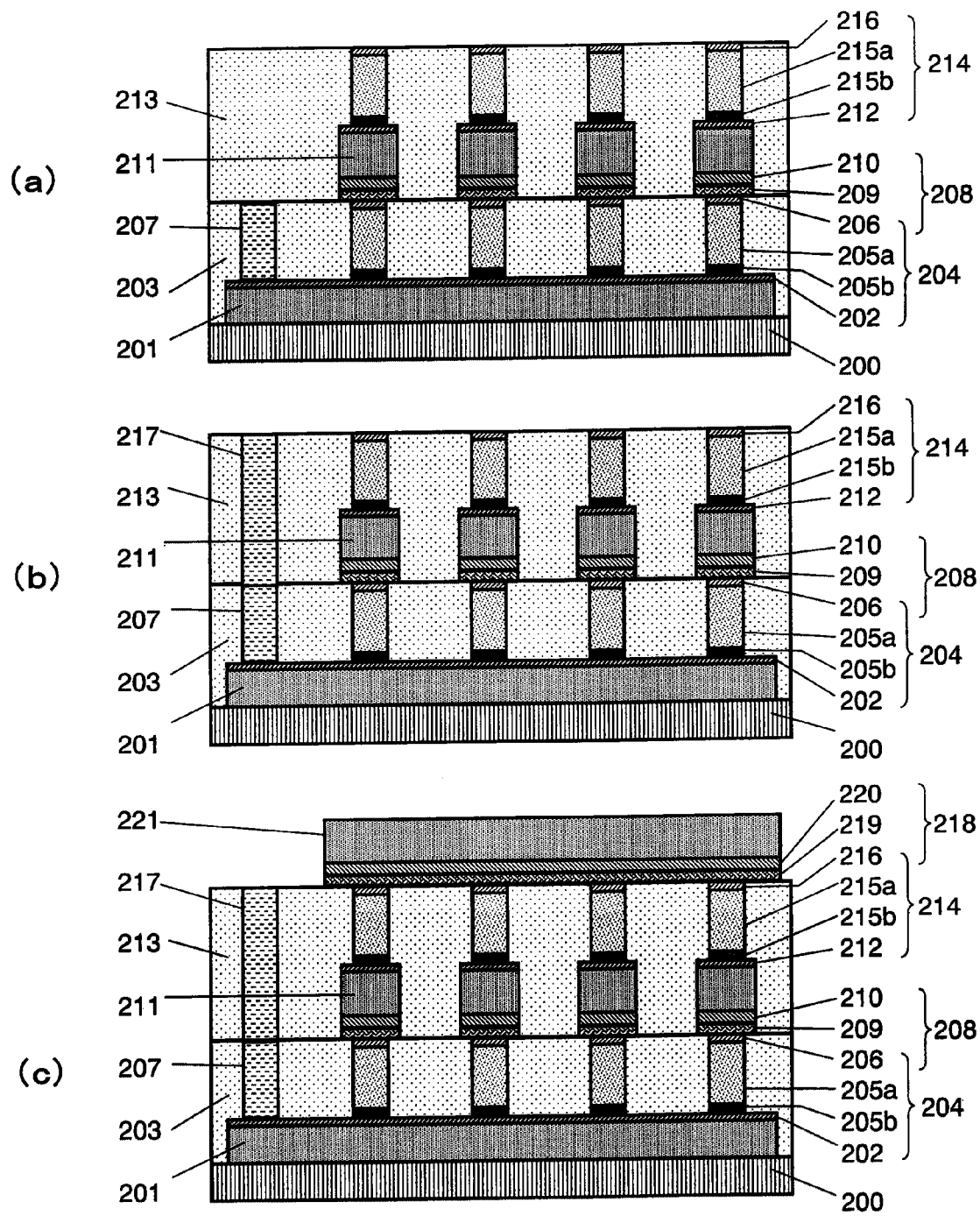
Figure 18:
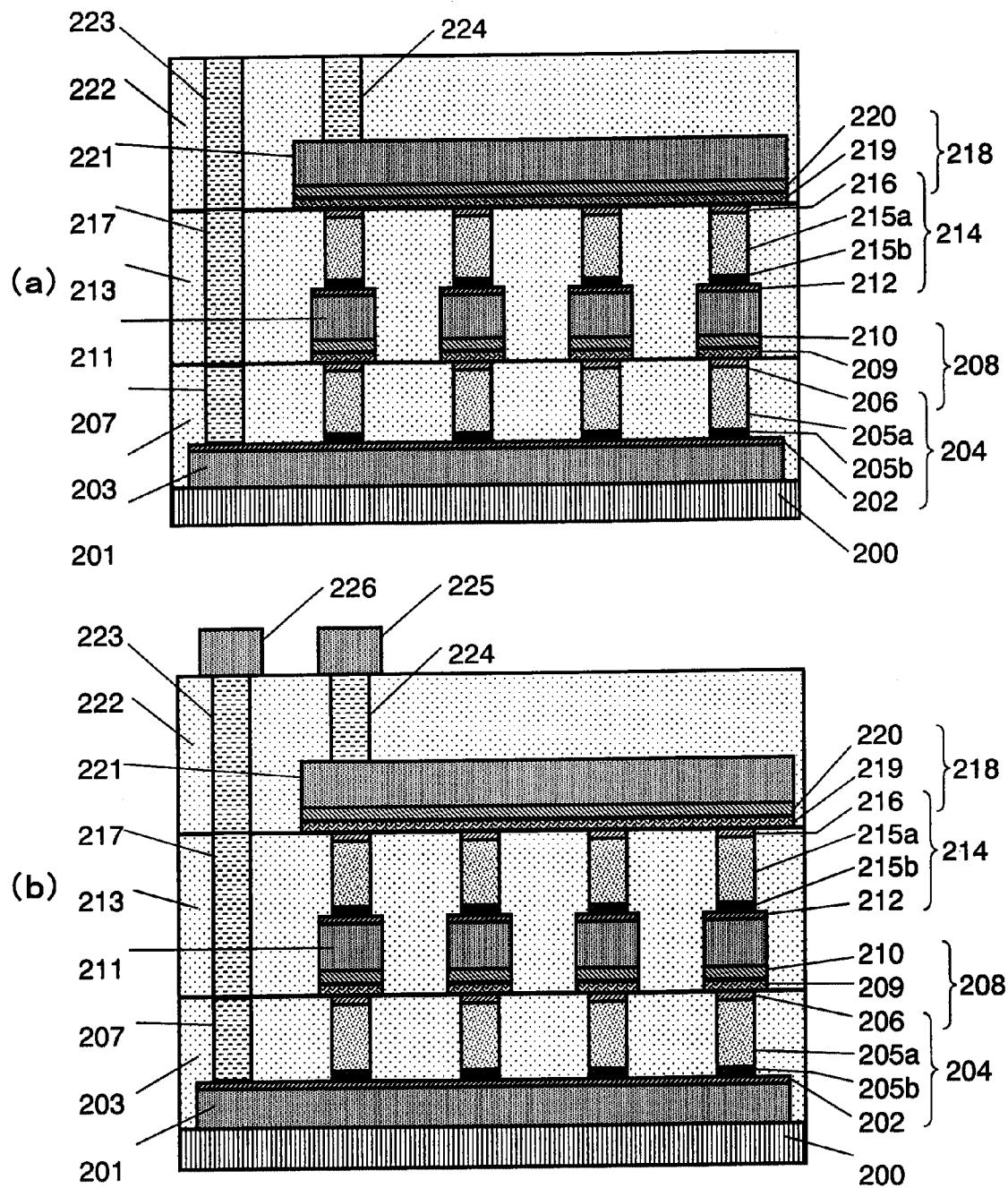
Figure 19:
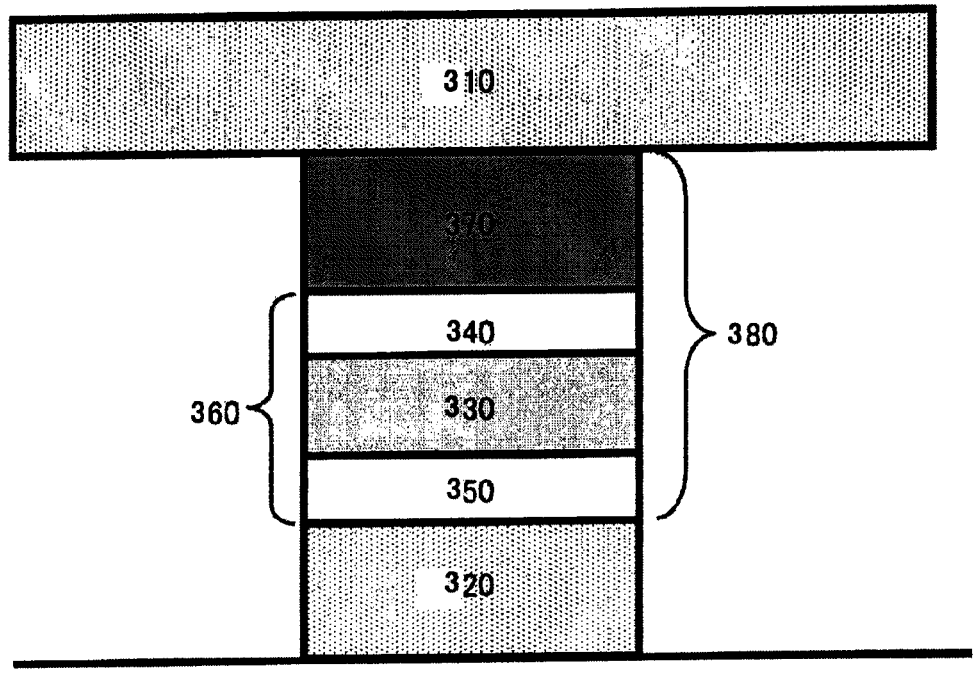
FIG. 19 is a view showing a nonvolatile memory device including a conventional resistance variable element.

Then, as shown in FIG. 16 (c), in the step of filling the material of the fourth resistance variable layers, oxygen-deficient tantalum oxide with low oxygen content is filled into the through-holes by sputtering (an unnecessary portion of resistance variable layer deposited on the second interlayer insulating layer 213 is also removed by CMP).

Then, as shown in FIG. 17(a), in the step of forming the second intermediate electrodes, a portion of the oxygen-deficient tantalum oxide with low oxygen content is removed by etching, completing the fourth resistance variable layers 215a. The second intermediate electrodes 216 comprising tantalum nitride are filled into the recesses formed on the fourth resistance variable layers 215a, respectively, by sputtering (an unnecessary portion of tantalum nitride deposited on the second interlayer insulating layer 213 is removed by CMP).

Then, as shown in FIG. 17(b), in the step of forming the second contact plugs, contact holes are formed to penetrate the second interlayer insulating layer 213 and reach the third conductive layers 212. The contact holes are filled with tungsten to form the second contact plugs 217.

Then, as shown FIG. 17(c), in the step of forming the second semiconductor layers, the fourth conductive layers and the third wires, the material (silicon or silicon nitride) of the second semiconductor layer 219, the material (tungsten) of the fourth conductive layer 220 and the material (copper) of the third wires 221 are formed in this order over the second interlayer insulating layer 213. Then, patterning is performed using a desired mask so as to cover the upper end surfaces of the second intermediate electrodes 216 and expose the upper end surfaces of the second contact plugs 217. The patterning is performed so that the third wires 221 cross the second wires 211 perpendicularly to the second wires 211, respectively, when viewed in the thickness direction.

Then, as shown in FIG. 18(a), in the step of forming the third interlayer insulating layer, the third contact plugs and the fourth contact plugs, the third interlayer insulating layer 222 is formed over the entire surface of the second interlayer insulating layer 213 to cover the second semiconductor layers 219, the fourth conductive layers 220 and the third wires 221. The contact holes (holes) are formed to penetrate the third interlayer insulating layer 222 and reach the upper end surfaces of the second contact plugs 217 and the upper end surfaces of the third wires 221. The contact holes are each filled with tungsten, thereby forming the third contact plugs 223 and the fourth contact plugs 224 (an unnecessary portion of tungsten deposited on the third interlayer insulating layer 222 is removed by CMP).

Then, as shown in FIG. 18(b), in the step of forming the first lead-out wires 225 and the second lead-out wires 226, the lead-out wires 225 and the lead-out wires 226 are patterned using a desired mask on the third interlayer insulating layer 222 such that the lead-out wire 225 and the lead-out wire 226 cover the upper end surface of the fourth contact plugs 224 and the upper end surface of the third contact plugs 223, respectively.

With the above explained manufacturing method, it is possible to implement a resistance variable nonvolatile memory device which performs a resistance changing operation stably and is adapted for a multi-layer structure and miniaturization.

Numerous modifications and alternative embodiments of the invention will be apparent to those skilled in the art in view of the foregoing description. Accordingly, the description is to be construed as illustrative only, and is provided for the purpose of teaching those skilled in the art the best mode of carrying out the invention. The details of the structure and/or function may be varied substantially without departing from the spirit of the invention.

INDUSTRIAL APPLICABILITY

A nonvolatile memory element and a nonvolatile memory device of the present invention are useful as a resistance variable nonvolatile memory element and a resistance variable nonvolatile memory device which can perform a resistance changing operation stably and can reduce a sneak current in a cross-point memory.

DESCRIPTION OF THE REFERENCE NUMERALS 10 nonvolatile memory device according to Embodiment 1 of the present invention
11 nonvolatile memory element according to Embodiment 1 of the present invention
20 nonvolatile memory device according to Embodiment 2 of the present invention
21 nonvolatile memory element according to Embodiment 2 of the present invention
30 nonvolatile memory device according to Embodiment 3 of the present invention
31 nonvolatile memory element according to Embodiment 3 of the present invention
40 nonvolatile memory device according to Embodiment 4 of the present invention
41 nonvolatile memory element according to Embodiment 4 of the present invention
42 nonvolatile memory element according to Embodiment 4 of the present invention
50 nonvolatile memory device incorporating conventional resistance variable element
100 substrate
101 first wire
102 first interlayer insulating layer
103 first contact plug
104 second contact plug
105 resistance variable element
106 lower electrode of resistance variable element
107 resistance variable layer
107a resistance variable layer (first layer) with low oxygen content
107b resistance variable layer (second layer) with high oxygen content
108 upper electrode of resistance variable element
109 second interlayer insulating layer
110 third contact plug
111 fourth contact plug
112 current controlling element
113, 113a lower electrode of current controlling element
114, 114a semiconductor layer
115, 115a upper electrode of current controlling element
116 third interlayer insulating layer
117 fifth contact plug
118 sixth contact plug
119 second wire
120 lead-out wire
121, 122 photoresist pattern
200 substrate
201 first wire
202 first conductive layer
203 first interlayer insulating layer
204 first resistance variable element
205a first resistance variable layer with low oxygen content
205b first resistance variable layer with high oxygen content
206 first intermediate electrode
207 first contact plug
208 first current controlling element
209 first semiconductor layer
210 second conductive layer
211 second wire
212 third conductive layer
213 second interlayer insulating layer
214 second resistance variable element
215a second resistance variable layer with low oxygen content
215b second resistance variable layer with high oxygen content
216 second intermediate electrode
217 second contact plug
218 second current controlling element
219 second semiconductor layer
220 fourth conductive layer
221 third wire
222 third interlayer insulating layer
223 third contact plug
224 fourth contact plug
225 first lead-out wire
226 second lead-out wire
310 upper wire (bit line)
320 lower wire (word line)
330 resistance variable layer
340 upper electrode
350 lower electrode
360 resistance variable element
370 non-linear element (varistor)
380 memory cell

The invention claimed is:

1. A nonvolatile memory element comprising:
a resistance variable element configured to reversibly change between a low-resistance state and a high-resistance state in response to electric signals with different polarities which are applied thereto; and
a current controlling element configured such that when a current flowing when a voltage whose absolute value is a first value as a desired value which is larger than 0 and smaller than a predetermined voltage value and whose polarity is a first polarity is applied is a first current and a current flowing when a voltage whose absolute value is the first value and whose polarity is a second polarity different from the first polarity is applied is a second current, the first current is higher than the second current;
the resistance variable element including a first electrode, a second electrode, and a resistance variable layer which comprises oxygen-deficient transition metal oxide and is provided between the first electrode and the second electrode;
the resistance variable element being connected in series with the current controlling element such that a polarity of a voltage applied to the current controlling element when the resistance variable element is changed from the low-resistance state to the high-resistance state is the first polarity; and a resistance changing phenomenon occurring at a specified one of an interface between the first electrode and the resistance variable layer and an interface between the second electrode and the resistance variable layer, in response to the electric signals applied between the first electrode and the second electrode.

2. A nonvolatile memory element comprising:

a resistance variable element configured to reversibly change between a low-resistance state and a high-resistance state corresponding to a resistance value larger than a resistance value corresponding to the low-resistance state, in response to electric signals with different polarities which are applied thereto; and a bidirectional current controlling element having an unsymmetric characteristic in which when a current flowing when a voltage whose absolute value is a first value as a desired value which is larger than 0 and smaller than a predetermined voltage value and whose polarity is a first polarity is applied is a first current and a current flowing when a voltage whose absolute value is the first value and whose polarity is a second polarity different from the first polarity is applied is a second current, the first current is higher than the second current;

the resistance variable element including a first electrode, a second electrode, and a resistance variable layer which comprises oxygen-deficient transition metal oxide and is provided between the first electrode and the second electrode;

the resistance variable element being connected in series with the current controlling element such that a direction of a current flowing through the resistance variable element when the resistance variable element is changed from the low-resistance state to the high-resistance state conforms to a direction of the first current flowing through the current controlling element; and a resistance changing phenomenon occurring at a specified one of an interface between the first electrode and the resistance variable layer and an interface between the second electrode and the resistance variable layer, in response to the electric signals applied between the first electrode and the second electrode.

3. The nonvolatile memory element according to claim 1, wherein the resistance variable element includes a first electrode, a second electrode and a resistance variable layer provided between the first electrode and the second electrode;

wherein the resistance variable element is configured such that a resistance value between the first electrode and the second electrode increases when an electric signal with a positive polarity is applied between the first electrode and the second electrode on the basis of the first electrode, and decreases when an electric signal with a negative polarity is applied between the first electrode and the second electrode on the basis of the first electrode;

wherein the resistance variable layer includes oxygen-deficient transition metal oxide;

wherein the current controlling element includes a third electrode, a fourth electrode and a semiconductor layer provided between the third electrode and the fourth electrode and is configured such that a polarity with which the fourth electrode is placed at a positive potential on the basis of the third electrode between the third electrode and the fourth electrode is the first polarity; and wherein the current controlling element is configured such that:

(A) the second electrode is connected to the third electrode such that the resistance variable layer and the semiconductor layer do not intervene between the second electrode and the third electrode, or (B) the first electrode is connected to the fourth electrode such that the resistance variable layer and the semiconductor layer do not intervene between the first electrode and the fourth electrode.

4. The nonvolatile memory element according to claim 1, wherein the resistance variable element includes a first electrode, a second electrode and a resistance variable layer provided between the first electrode and the second electrode;

wherein the resistance variable element is configured such that a resistance value between the first electrode and the second electrode increases when an electric signal with a positive polarity is applied between the first electrode and the second electrode on the basis of the first electrode, and decreases when an electric signal with a negative polarity is applied between the first electrode and the second electrode on the basis of the first electrode;

wherein the resistance variable layer includes oxygen-deficient transition metal oxide; and wherein the current controlling element includes a third electrode, the first electrode and a semiconductor layer provided between the third electrode and the first electrode and is configured such that a polarity with which the first electrode is placed at a positive potential on the basis of the third electrode between the third electrode and the first electrode is the first polarity.

5. The nonvolatile memory element according to claim 1, wherein the resistance variable element includes a first electrode, a second electrode and a resistance variable layer provided between the first electrode and the second electrode;

wherein the resistance variable element is configured such that a resistance value between the first electrode and the second electrode increases when an electric signal with a positive polarity is applied between the first electrode and the second electrode on the basis of the first electrode, and decreases when an electric signal with a negative polarity is applied between the first electrode and the second electrode on the basis of the first electrode;

wherein the resistance variable layer includes oxygen-deficient transition metal oxide; and wherein the current controlling element includes the second electrode, a fourth electrode and a semiconductor layer provided between the second electrode and the fourth electrode and is configured such that a polarity with which the fourth electrode is placed at a positive potential on the basis of the second electrode between the second electrode and the fourth electrode is the first polarity.

6. The nonvolatile memory element according to claim 3, wherein the first electrode comprises a first material;

the second electrode comprises a second material; and when a standard electrode potential of the first material is V1, a standard electrode potential of the second material is V2, and a standard electrode potential of transition metal of the oxygen-deficient transition metal oxide is Vt, Vt<V2 and V1<V2 are satisfied.

7. The nonvolatile memory element according to claim 3, wherein the resistance variable layer includes a first layer which is configured to physically contact the first electrode and has a composition expressed as $MO_x$ (M: transition metal element) and a second layer which is configured to physically contact the second electrode and has a composition expressed as $MO_y$, and $x<y$ is satisfied.

8. The nonvolatile memory element according to claim 3, wherein the semiconductor layer comprises n-type semiconductor;
the third electrode and the fourth electrode comprise different materials; and
when electron affinity of the semiconductor layer is $\chi s$, a work function of the third electrode is $\phi 1$, and a work function of the fourth electrode is $\phi 2$, $\chi s<\phi 1<\phi 2$ is satisfied.

9. The nonvolatile memory element according to claim 4, wherein the semiconductor layer comprises n-type semiconductor;
the third electrode and the first electrode comprise different materials; and
when electron affinity of the semiconductor layer is $\chi s$, a work function of the third electrode is $\phi 1$, and a work function of the first electrode is $\phi 2$, $\chi s<\phi 1<\phi 2$ is satisfied.

10. The nonvolatile memory element according to claim 5, wherein the semiconductor layer comprises n-type semiconductor;
the second electrode and the fourth electrode comprise different materials; and
when electron affinity of the semiconductor layer is $\chi s$, a work function of the second electrode is $\phi 1$, and a work function of the fourth electrode is $\phi 2$, $\chi s<\phi 1<\phi 2$ is satisfied.

11. The nonvolatile memory element according to claim 3, wherein
when an area of a portion of the third electrode and a portion of the semiconductor layer which are in contact with each other is S1, and an area of a portion of the fourth electrode and a portion of the semiconductor layer which are in contact with each other is S2, S1>S2 is satisfied.

12. The nonvolatile memory element according to claim 4, wherein
when an area of a portion of the third electrode and a portion of the semiconductor layer which are in contact with each other is S1, and an area of a portion of the first electrode and a portion of the semiconductor layer which are in contact with each other is S2, S1>S2 is satisfied.

13. The nonvolatile memory element according to claim 5, wherein
when an area of a portion of the second electrode and a portion of the semiconductor layer which are in contact with each other is S1, and an area of a portion of the fourth electrode and a portion of the semiconductor layer which are in contact with each other is S2, S1>S2 is satisfied.

14. The nonvolatile memory element according to claim 3, wherein the transition metal oxide is tantalum oxide or hafnium oxide.

15. A cross-point nonvolatile memory device comprising:
a substrate;
a plurality of first wires which are formed to extend in parallel with each other on the substrate;
a plurality of second wires which are formed above the plurality of first wires such that the plurality of second wires extend in parallel with each other within a plane parallel to a main surface of the substrate and three-dimensionally cross the plurality of first wires, respectively; and
a plurality of nonvolatile memory elements each of which is recited in claim 1 and which are provided to respectively correspond to three-dimensional cross-points of the plurality of first wires and the plurality of second wires and to electrically connect the first wires to the second wires, respectively.

* * * * *